United States Patent
Kaneko et al.

(10) Patent No.: US 11,647,624 B2
(45) Date of Patent: May 9, 2023

(54) APPARATUSES AND METHODS FOR CONTROLLING STRUCTURE OF BOTTOM ELECTRODES AND PROVIDING A TOP-SUPPORT THEREOF

(71) Applicant: MICRON TECHNOLOGY, INC., Boise, ID (US)

(72) Inventors: Akira Kaneko, Higashihiroshima (JP); Keisuke Otsuka, Kasaoka (JP)

(73) Assignee: Micron Technology, Inc., Boise, ID (US)

(*) Notice: Subject to any disclaimer, the term of this patent is extended or adjusted under 35 U.S.C. 154(b) by 114 days.

(21) Appl. No.: 17/122,706

(22) Filed: Dec. 15, 2020

(65) Prior Publication Data
US 2022/0189960 A1    Jun. 16, 2022

(51) Int. Cl.
*H01L 27/108* (2006.01)

(52) U.S. Cl.
CPC .. *H01L 27/10808* (2013.01); *H01L 27/10852* (2013.01)

(58) Field of Classification Search
CPC ......... H01L 27/10808; H01L 27/10852; H01L 27/11519; H01L 27/11548; H01L 27/11582; H01L 27/11556
See application file for complete search history.

(56) References Cited

U.S. PATENT DOCUMENTS

| | | |
|---|---|---|
| 2012/0019980 A1 | 1/2012 | Cho et al. |
| 2013/0250477 A1 | 9/2013 | Lim |
| 2018/0166542 A1 | 6/2018 | Kim |
| 2019/0131306 A1 | 5/2019 | Lee et al. |
| 2021/0036101 A1* | 2/2021 | Choi ............ H01L 28/91 |

FOREIGN PATENT DOCUMENTS

| | | |
|---|---|---|
| KR | 20100004648 A | 1/2010 |
| KR | 20180116672 A | 10/2018 |
| TW | 200532792 A | 10/2005 |
| TW | 200539422 A | 12/2005 |

OTHER PUBLICATIONS

ISR/WO dated Mar. 4, 2022 for PCT Appl. No. PCT/US2021/059257.

* cited by examiner

*Primary Examiner* — Mohammed R Alam
(74) *Attorney, Agent, or Firm* — Dorsey & Whitney LLP

(57) ABSTRACT

An apparatus includes: a substrate; a plurality of pillar-shaped bottom electrodes provided over the substrate; and an upper electrode covering side and top surfaces of the pillar-shaped bottom electrodes with an intervening capacitor insulating film therebetween; wherein the pillar-shaped bottom electrodes have at least an upper portion and a lower portion, and the diameter of the upper portion is smaller than the diameter of the lower portion.

12 Claims, 24 Drawing Sheets

APPARATUSES AND METHODS FOR CONTROLLING STRUCTURE OF BOTTOM ELECTRODES AND PROVIDING A TOP-SUPPORT THEREOF

BACKGROUND

In a semiconductor device such as dynamic random access memory (hereinafter referred to as DRAM) for example, data is retained by accumulating charge in an internally provided capacitor. Recently, the size of elements including a capacitor is being reduced in order to increase the data storage capacity of DRAM.

However, because the capacitor adopts a conductor-insulator-conductor stacked structure, reducing the size of the capacitor reduces the capacitance of the capacitor, and the data retention characteristics are worsened. The capacitance of a capacitor depends on the surface area of the capacitor structure. In recent years, to increase the surface area of the capacitor, a vertical capacitor structure has been proposed in which a conductor is formed inside a hole formed with a high aspect ratio in the vertical direction, and the conductor is used as the bottom electrode.

However, with the vertical capacitor structure, because the hole has a high aspect ratio in the vertical direction, the bottom diameter of the hole decreases while the top diameter of the hole increases. If the bottom electrode of the capacitor is formed by burying a conductor in the hole, the bottom diameter of the bottom electrode decreases while the top diameter of the bottom electrode increases. For this reason, at the top of the bottom electrode, the interval with respect to a neighboring bottom electrode becomes narrow, and in some cases, a capacitor insulating film and the top electrode cannot be formed. Also, if one attempts to reduce the top diameter of the bottom electrode, the bottom diameter becomes smaller, and an opening may not be formed in the floor of the bottom electrode in some cases.

BRIEF DESCRIPTION OF THE DRAWINGS

FIGS. 1A and 1B to FIGS. 10A, 10B, and 10C are diagrammatic views of a semiconductor device and a method of forming the same according to a first embodiment, and sequentially illustrate an example of the schematic configuration in exemplary process stages. FIGS. 1A to 10A are plan views that sequentially illustrate an example of the schematic configuration in exemplary process stages. FIGS. 1B to 10B are longitudinal sections that sequentially illustrate an example of the schematic configuration in exemplary process stages, and are longitudinal sections illustrating an example of the schematic configuration of the portion along the line A-A in FIGS. 1A to 10A. FIGS. 10A, 10B, and 10C are diagrams illustrating an example of the schematic configuration in a final process stage of the semiconductor device according to the first embodiment. FIG. 10C is an enlarged view of the portion H in FIG. 10B.

FIGS. 11A and 11B to FIGS. 17A and 17B are diagrammatic views of a semiconductor device and a method of forming the same according to a second embodiment, and sequentially illustrate an example of the schematic configuration in exemplary process stages. FIGS. 11A to 17A are plan views that sequentially illustrate an example of the schematic configuration in exemplary process stages. FIGS. 11B to 17B are longitudinal sections that sequentially illustrate an example of the schematic configuration in exemplary process stages, and are longitudinal sections illustrating an example of the schematic configuration of the portion along the line A-A in FIGS. 11A to 17A.

FIGS. 18A and 18B to FIGS. 21A and 21B are diagrammatic views of a semiconductor device and a method of forming the same according to a third embodiment, and sequentially illustrate an example of the schematic configuration in exemplary process stages. FIGS. 18A to 21A are plan views that sequentially illustrate an example of the schematic configuration in exemplary process stages. FIGS. 18B to 21B are longitudinal sections that sequentially illustrate an example of the schematic configuration in exemplary process stages, and are longitudinal sections illustrating an example of the schematic configuration of the portion along the line A-A in FIGS. 18A to 21A. FIGS. 18A and 18B illustrate an example of the schematic configuration in an exemplary process stage following the step illustrated in FIGS. 14A and 14B.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Hereinafter, several embodiments will be described with reference to the drawings. In the following description, DRAM is given as an example of a semiconductor device 1 (1A, 1B, 1C).

Figure 21A:
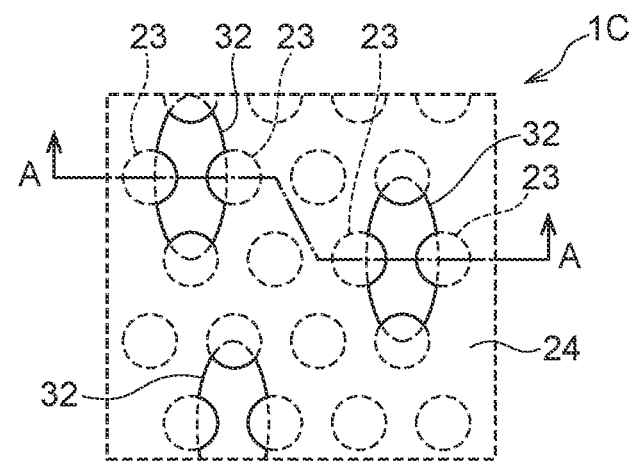
Figure 21B:
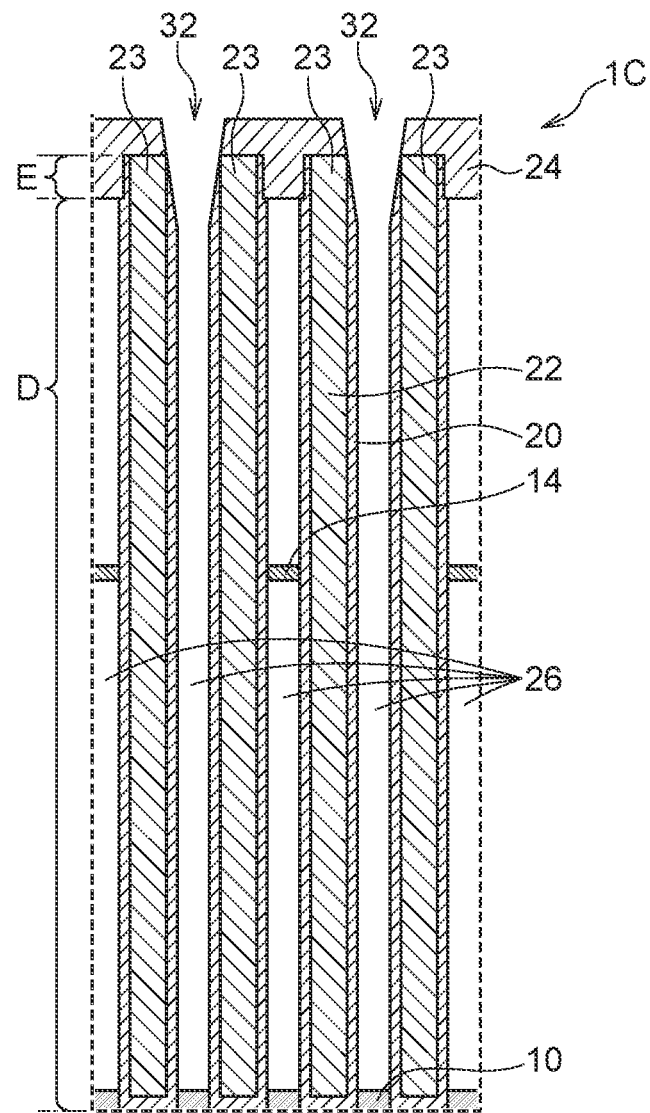
Figure 22:
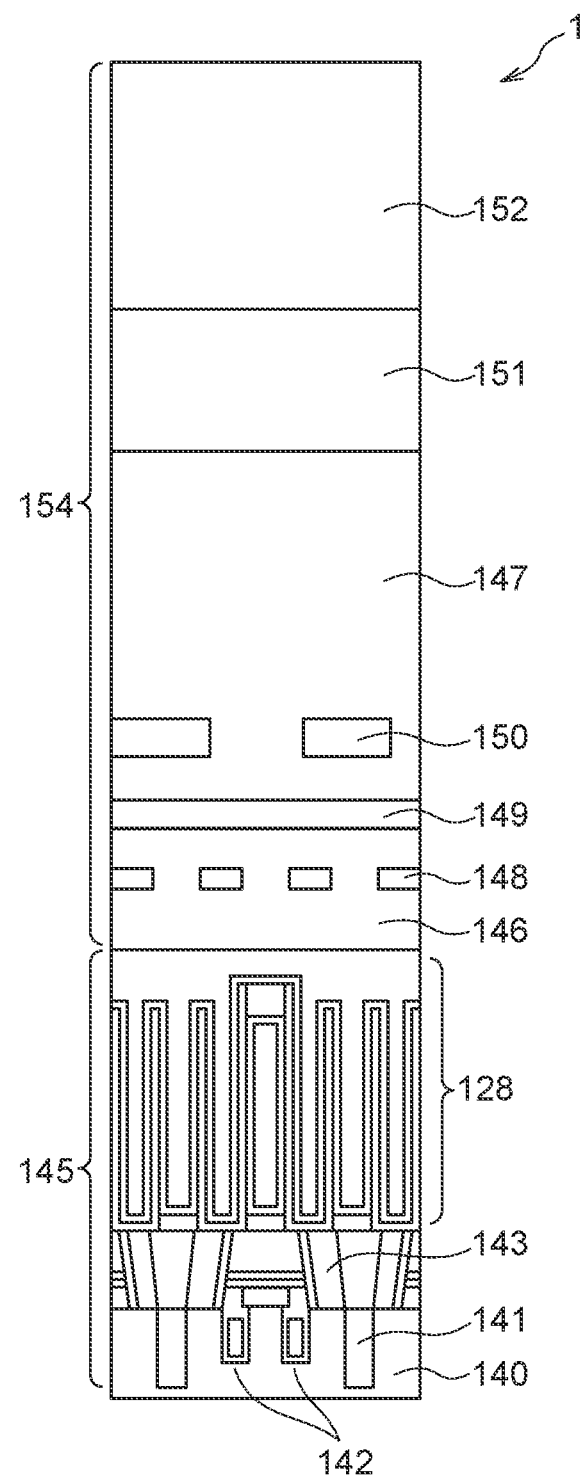
FIG. 22 is a longitudinal section illustrating an example of an overall schematic configuration of a semiconductor memory device according to the first, second, and third embodiments.

FIG. 22 is a longitudinal section illustrating one example of an overall diagrammatic configuration of a memory cell region in the semiconductor device 1 according to an embodiment. A capacitor 128 illustrated in FIG. 22 corresponds to the region illustrated in FIGS. 1B to 21B described later. As illustrated in FIG. 22, below the capacitor 128, components such as a semiconductor substrate 140, a shallow trench isolation 141, an access transistor 142, and a capacitor contact 143 included in a memory cell 145 of DRAM are provided. The capacitor 128 is provided on the semiconductor substrate 140 in which components such as the shallow trench isolation 141, the access transistor 142, and the capacitor contact 143 are formed.

A bottom electrode of the capacitor 128 illustrated in FIG. 22 is electrically connected, through the capacitor contact 143, to one side of a source-drain region of the access transistor 142 formed in an active region of the semiconductor substrate 140. A bottom electrode 120 of the capacitor 128 is connected to the semiconductor substrate 140. The bottom electrode 120 is pillar-shaped extending in the vertical direction.

Like the configuration illustrated in FIG. 22, components such as the semiconductor substrate 140, the shallow trench isolation 141, the access transistor 142, and the capacitor contact 143 are provided below the diagrams illustrated in FIGS. 1B to 21B described later. The steps illustrated in FIGS. 1B to 21B described later are performed on the semiconductor substrate 140 provided with components such as the shallow trench isolation 141, the access transistor 142, and the capacitor contact 143.

Also, as illustrated in FIG. 22, an upper layer part 154 that includes multilevel upper wiring layers containing components such as interconnects 148, 149, 150, and 151 is provided above the capacitor 128. The upper layer part 154 is disposed above the memory cell 145. A top electrode 126 of the capacitor 128 is disposed near the multilevel upper wiring layers containing components such as the interconnects 148, 149, 150, and 151. The reference signs 146, 147, and 152 illustrated in FIG. 22 denote insulating films.

After the step illustrated in FIGS. 10A and 10B described later, the multilevel upper wiring layers are formed above the top electrode 126 of the capacitor 128, like the configuration illustrated in FIG. 22. The top electrode 126 of the capacitor 128 illustrated in FIG. 10B described later is disposed near the multilevel upper wiring layers.

In the cross-section views illustrated in FIGS. 1B to 21B, a portion of a memory cell is drawn and a plurality of capacitors are illustrated. In actuality, components such as the active region, the access transistor, a word line, and a bit line that form the DRAM memory cell illustrated in FIG. 22 are provided below these diagrams. Like the configuration illustrated in FIG. 22, a bottom electrode 23 of the capacitor illustrated in FIG. 10B is electrically connected to one side of a source-drain region of the access transistor formed in the active region of the semiconductor substrate.

First Embodiment

Figure 1A:
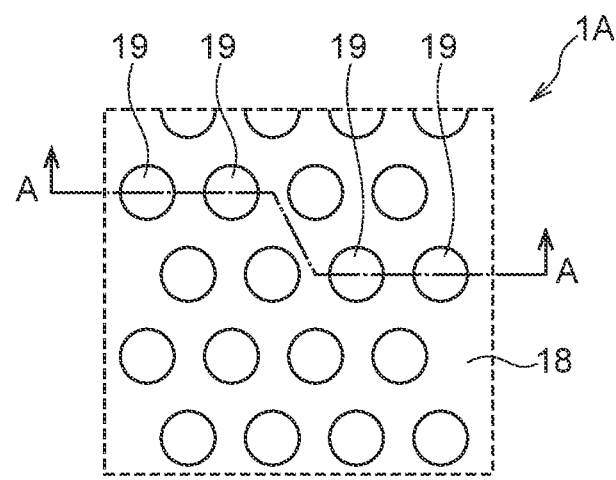
Figure 1B:
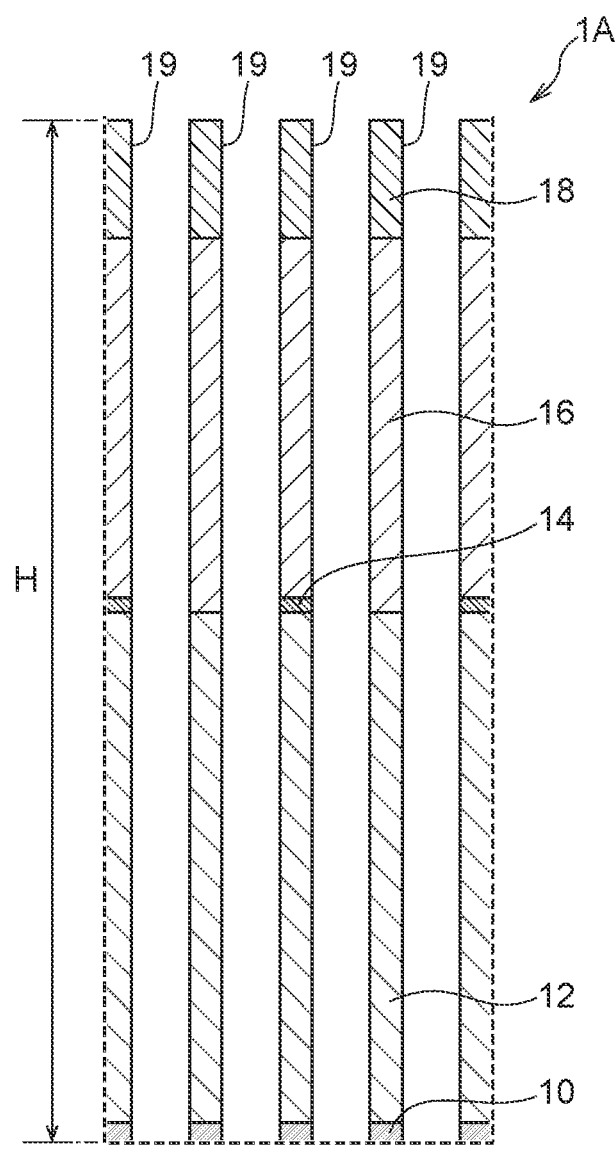

Hereinafter, a semiconductor device 1A and a method of forming the same according to the first embodiment will be described. As illustrated in FIGS. 1A and 1B, a first insulating film 10, a second insulating film 12, a third insulating film 14, a fourth insulating film 16, and a fifth insulating film 18 are formed on a semiconductor substrate provided with components such as an active region, an access transistor, a word line, and a bit line, which are not illustrated here. The first insulating film 10, the second insulating film 12, the third insulating film 14, and the fourth insulating film 16 all contain an insulating film. The first insulating film 10 and the third insulating film 14 contain silicon nitride (SiN) for example. The second insulating film 12 and the fourth insulating film 16 contain silicon dioxide ($SiO_2$) for example.

The second insulating film 12 contains borophosphosilicate glass (BPSG) for example, which is silicon dioxide doped with boron (B) and phosphorus (P). The fourth insulating film 16 contains silicon dioxide formed by plasma CVD using tetraethoxysilane (TEOS) as a raw material, for example. The fifth insulating film 18 contains a material having an etching selectivity ratio with respect to silicon dioxide. For example, the fifth insulating film 18 contains a material such as silicon, amorphous carbon, or tungsten.

The first insulating film 10, the second insulating film 12, the third insulating film 14, the fourth insulating film 16, and the fifth insulating film 18 are formed by chemical vapor deposition (hereinafter referred to as CVD), for example. The third insulating film 14 is patterned in a pattern similar to a sixth insulating film 24 illustrated in FIGS. 8A and 8B described later using known photolithography technology and dry etching technology.

With respect to the structure in which the first insulating film 10, the second insulating film 12, the third insulating film 14, the fourth insulating film 16, and the fifth insulating film 18 are sequentially formed in this way, a plurality of holes 19 are formed using known photolithography technology and dry etching technology, as illustrated in FIGS. 1A and 1B. As illustrated in FIG. 1A, each of the holes 19 is round in a plan view, and the holes 19 are arranged in a staggered layout.

The holes 19 are formed as follows. For example, first, photolithography technology and dry etching technology are used to pattern the fifth insulating film 18, and then the photoresist is removed. Next, the patterned fifth insulating film 18 is used as an etching mask to etch the fourth insulating film 16, the third insulating film 14, the second insulating film 12, and the first insulating film 10. Thereafter, the fifth insulating film 18 is removed.

As illustrated in FIG. 1B, the holes 19 are formed penetrating from a top face of the fifth insulating film 18 to a bottom face of the first insulating film 10. The vertical length H of the holes 19 is extremely long compared to the diameter of the holes 19. In other words, the aspect ratio of the holes 19 is extremely large. Herein, the aspect ratio of each hole 19 is computed by taking "vertical length H of hole 19/diameter of hole 19". For the diameter of the holes 19, the diameter at the upper end of the holes 19 is used.

As illustrated in FIGS. 1A and 1B, because the holes 19 have a large aspect ratio, the opening diameter in an upper portion of the holes 19 is large, while the opening diameter in a lower portion is small.

Figure 2A:
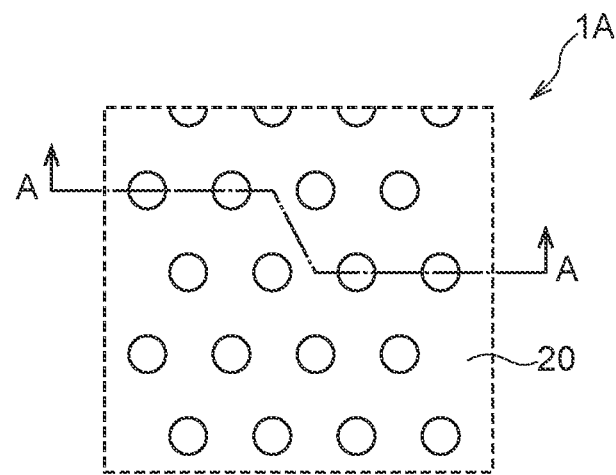
Figure 2B:
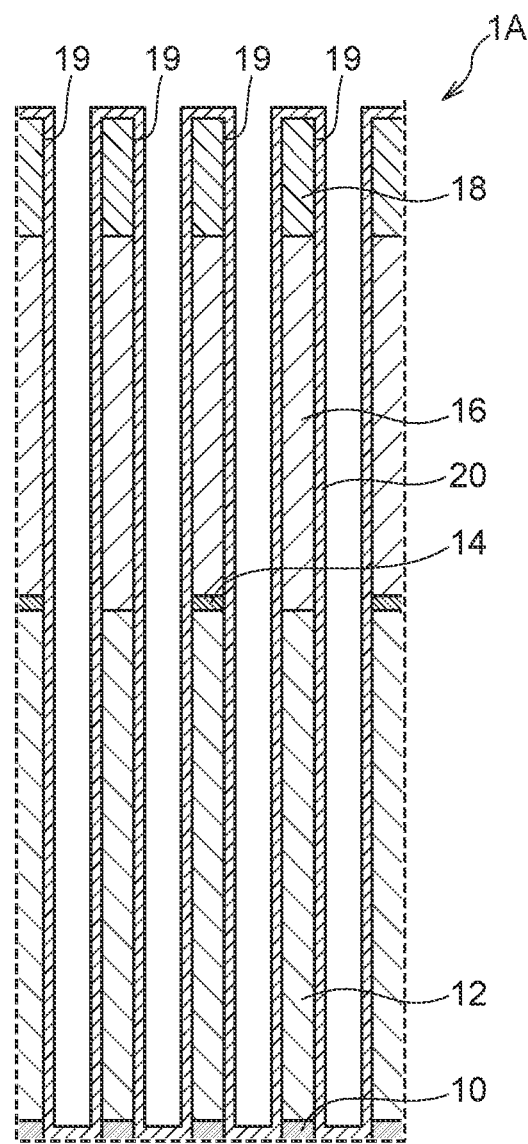

Next, as illustrated in FIGS. 2A and 2B, a first conductive film 20 is formed so as to cover the inside of the holes 19 and the top face of the fifth insulating film 18. The first conductive film 20 is a conductor containing a metal such as titanium nitride (TiN), for example. The first conductive film 20 is formed by CVD, for example. The first conductive film 20 is formed along the side walls inside the holes 19, having a thickness that is not enough to fill the holes 19.

Figure 3A:
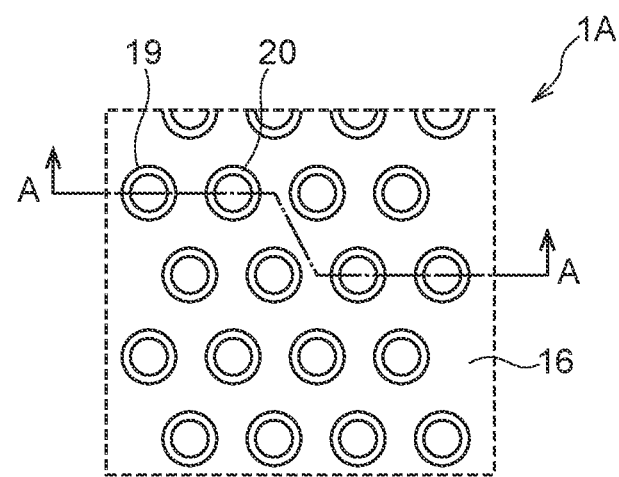
Figure 3B:
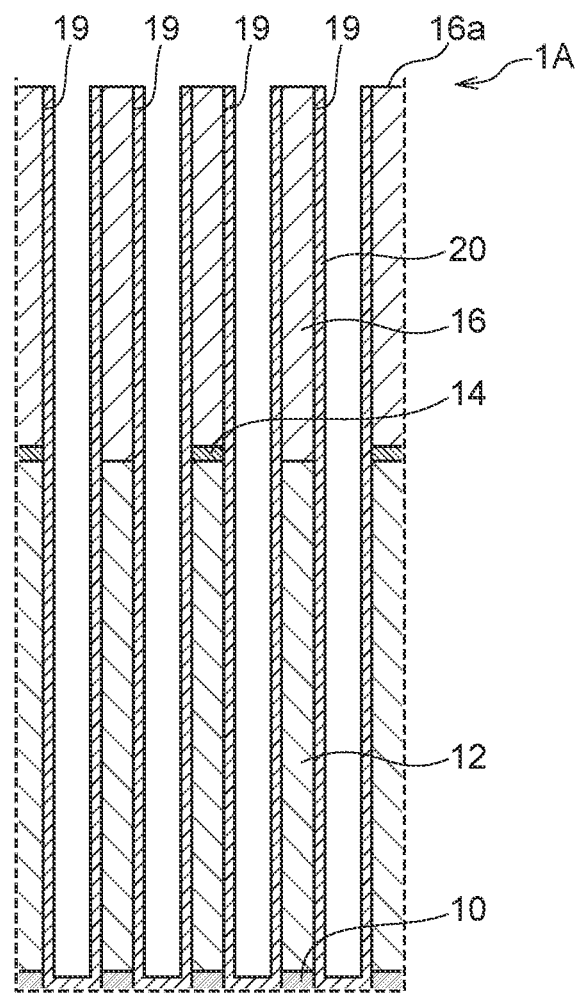

Next, as illustrated in FIGS. 3A and 3B, the first conductive film 20 and the fifth insulating film 18 are etched back under etching conditions such that the etch rates of the first conductive film 20 and the fifth insulating film 18 are substantially the same, until a top face 16a of the fourth insulating film 16 is exposed. With this configuration, the first conductive film 20 can be formed along the side walls and the floor inside the holes 19. The first conductive film 20 is cup-shaped.

Inside each of the holes 19, a cavity is formed on the inner side of the first conductive film 20. Note that instead of the above etchback, the first conductive film 20 and the fifth insulating film 18 may also be subjected to chemical mechanical polishing (hereinafter referred to as "CMP") until the top face 16a of the fourth insulating film 16 is exposed.

Figure 4A:
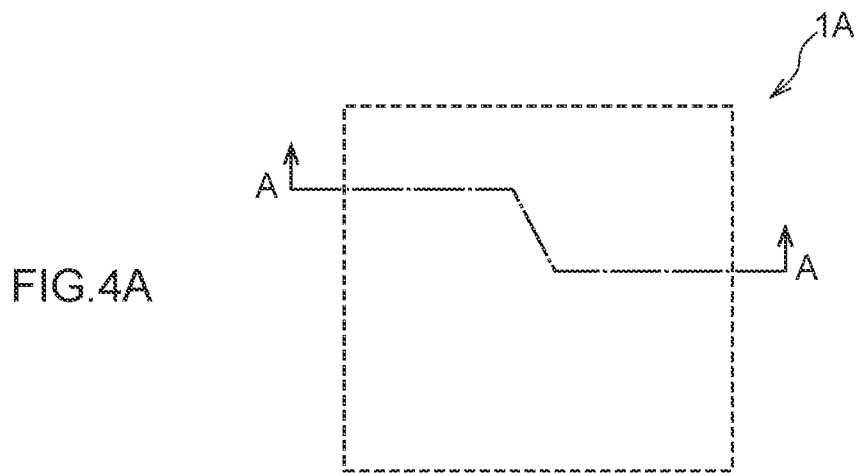
Figure 4B:
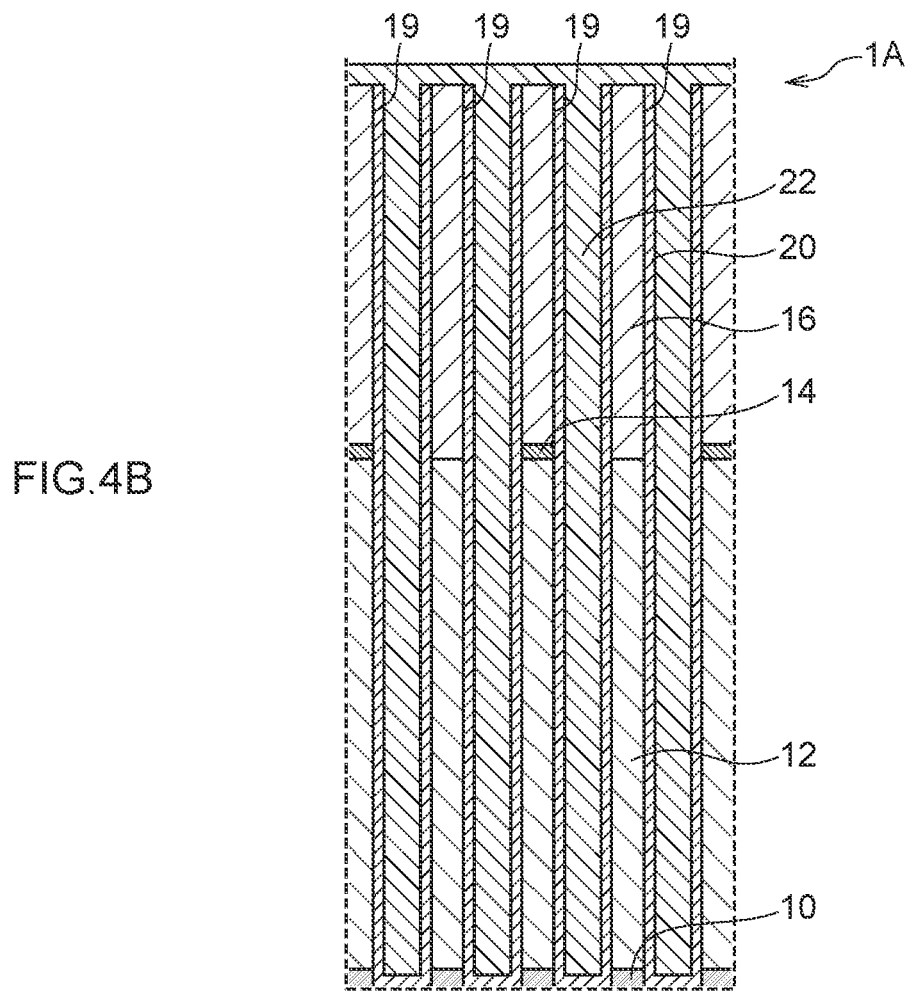

Next, as illustrated in FIGS. 4A and 4B, a second conductive film 22 is formed so as to be embedded inside the holes 19 and covering the top faces of the fourth insulating film 16 and the first conductive film 20 as well as the inner walls of the first conductive film 20. The second conductive film 22 contains a metal such as titanium nitride (TiN), for example. The second conductive film 22 is formed by CVD, for example.

Figure 5A:
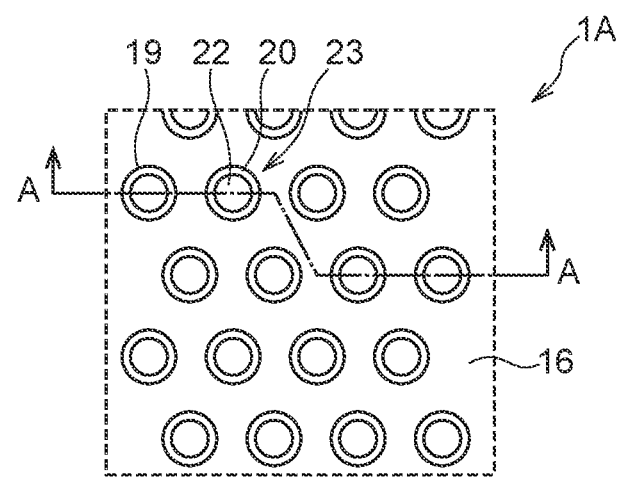
Figure 5B:
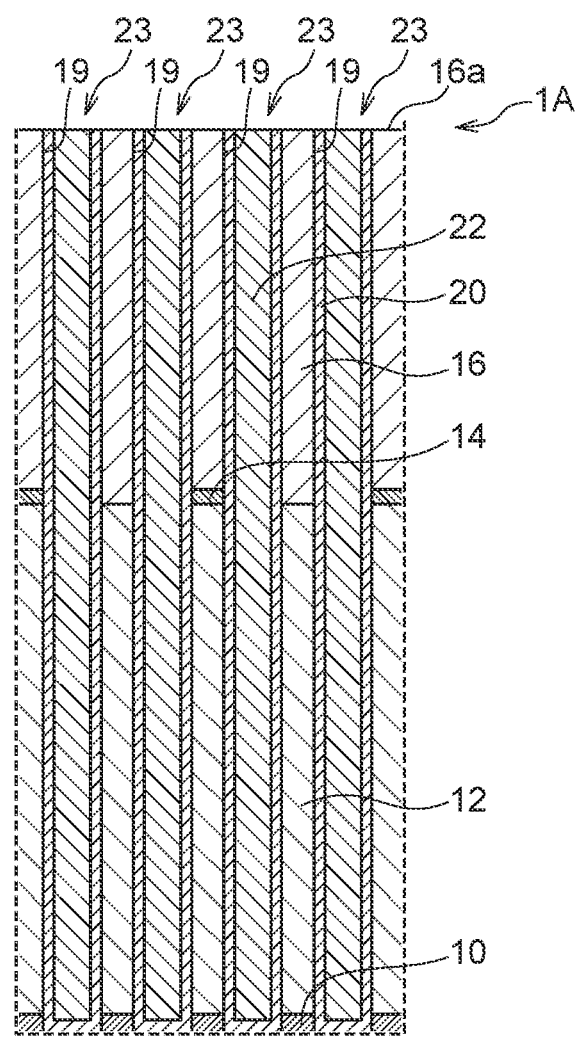

Next, as illustrated in FIGS. 5A and 5B, the second conductive film 22 is etched back until the top face 16a of the fourth insulating film 16 is exposed. With this configuration, a bottom electrode 23 containing the first conductive film 20 and the second conductive film 22 can be formed inside each of the holes 19. Because the first conductive film 20 and the second conductive film 22 both contain titanium nitride, the first conductive film 20 and the second conductive film 22 unite to form the bottom electrodes 23. Note that instead of the above etchback, the second conductive film 22 may also be subjected to CMP until the top face 16a of the fourth insulating film 16 is exposed. The bottom electrodes 23 are pillar-shaped extending in the vertical direction. Note that the bottom electrode 23 means the "bottom electrode" of the capacitor described later, and does not necessarily mean that the bottom electrode is physically positioned lower.

Figure 6A:
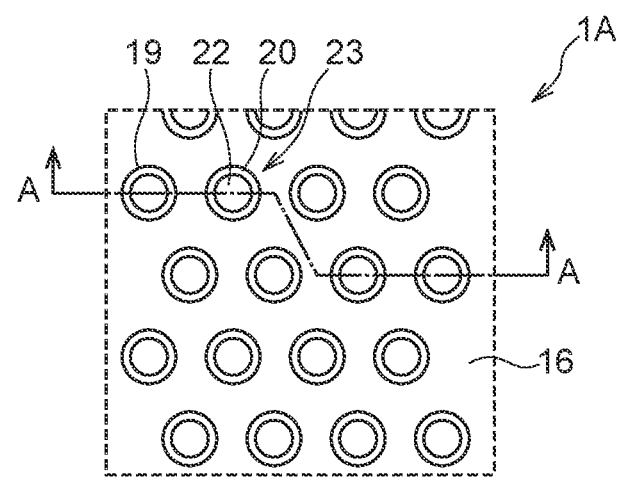
Figure 6B:
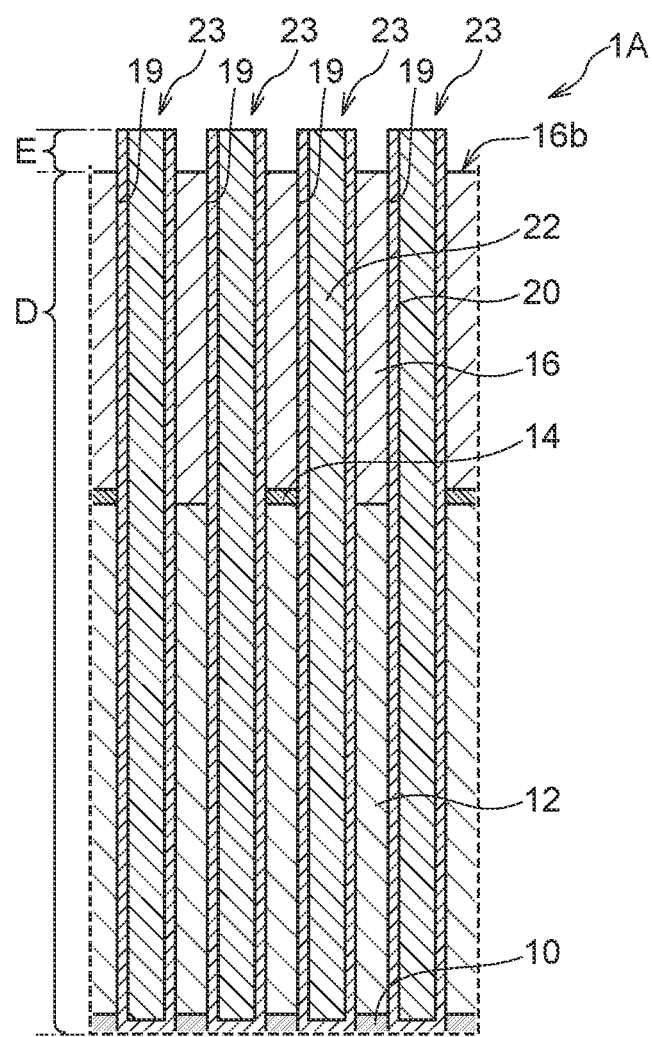

Next, as illustrated in FIGS. 6A and 6B, buffered hydrofluoric acid (hereinafter referred to as BHF) is used to etch the fourth insulating film 16. Because the fourth insulating film 16 containing silicon dioxide and the bottom electrodes 23 containing titanium nitride have different etch rates, this etching can selectively etch the fourth insulating film 16. Because the fourth insulating film 16 is etched by this etching, for example, removing a top part of the insulating film 16, an upper portion E is formed in which a portion of the bottom electrodes 23 projects upward from the top face 16b of the fourth insulating film 16.

The upper portion E is disposed on the upper ends of the bottom electrodes 23. The portion of bottom electrodes 23 buried in the fourth insulating film 16 is referred to as a lower portion D. The amount by which the upper portion E projects is determined by controlling the duration of the above etching. Note that instead of etching with BHF as above, dry etching capable of selectively etching the fourth insulating film 16 may also be performed.

Figure 7A:
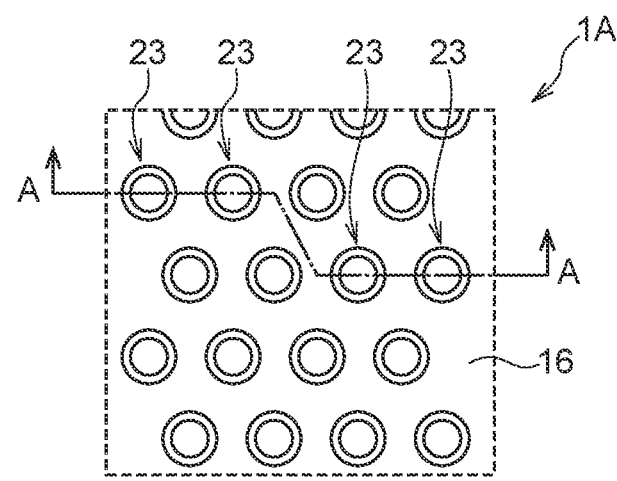
Figure 7B:
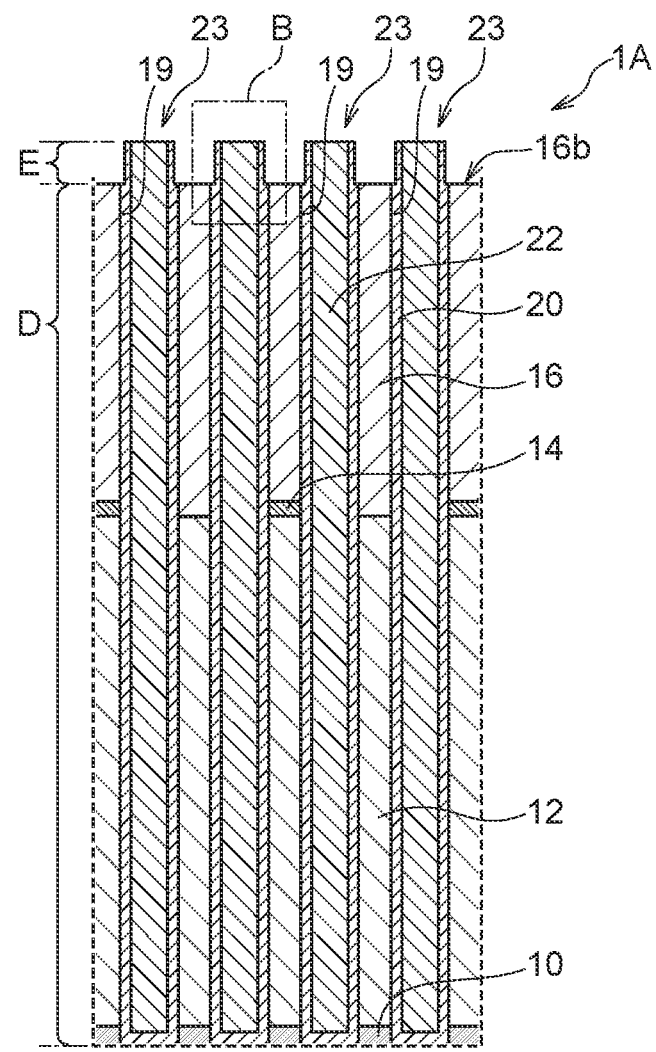

Next, as illustrated in FIGS. 7A and 7B, the upper portion E of the bottom electrodes 23 exposed from the fourth insulating film 16 is etched to narrow the diameter. The etching is performed using a diluted hydrogen peroxide solution, for example. The titanium nitride included in the bottom electrodes 23 is etched by the diluted hydrogen peroxide solution.

The silicon dioxide included in the fourth insulating film 16 has an extremely low etch rate with respect to the diluted hydrogen peroxide solution, and has a sufficient selectivity ratio with respect to titanium nitride. Consequently, the etching amount of the fourth insulating film 16 is small enough to ignore compared to the etching amount of the bottom electrodes 23.

Figure 7C:
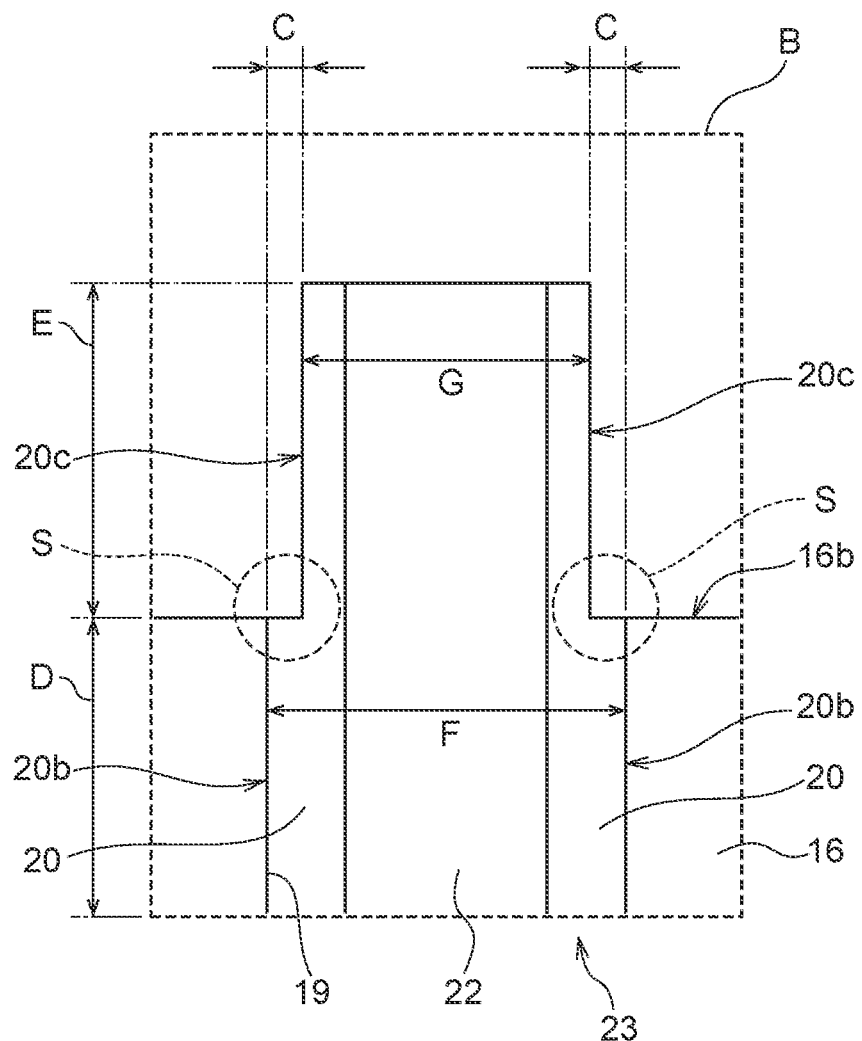
FIG. 7C is an enlarged view of the portion B in FIG. 7B.

FIG. 7C is an enlarged view of the portion B in FIG. 7B. A diameter G of one of the bottom electrodes 23 in the upper portion E is smaller than a diameter F of the bottom electrode 23 in the lower portion D. The upper portion E has retreated by a retreat amount C due to the etching. Because the upper portion E is etched the retreat amount C by the diluted hydrogen peroxide solution, the diameter of the upper portion E is smaller than the diameter of the lower portion D by "2C". A difference exists between the diameter of the bottom electrode 23 in the lower portion D and the diameter of the bottom electrode 23 in the upper portion E. Consequently, a step S is formed at the boundary between a first side face 20b of the bottom electrode 23 in the lower portion D and a second side face 20c of the bottom electrode 23 in the upper portion E.

The shape of the bottom electrodes 23 depends on the shape of the holes 19 formed in the step illustrated in FIGS. 1A and 1B. The holes 19 have a tapered shape in which the diameter is larger on the upper side of the diagram and smaller on the lower side. The bottom electrodes 23 formed by filling the holes 19 with a conductive material have a large diameter in the upper part of the diagram. Consequently, the distance between adjacent bottom electrodes 23 is shortest on the upper side.

According to the embodiment, by etching the upper part, that is to say the upper portion E, of the bottom electrodes 23, the diameter is decreased. With this configuration, a wider distance can be set between the bottom electrodes 23 adjacently arranged. Consequently, a short circuit between the bottom electrodes 23 adjacently arranged can be suppressed.

Figure 8A:
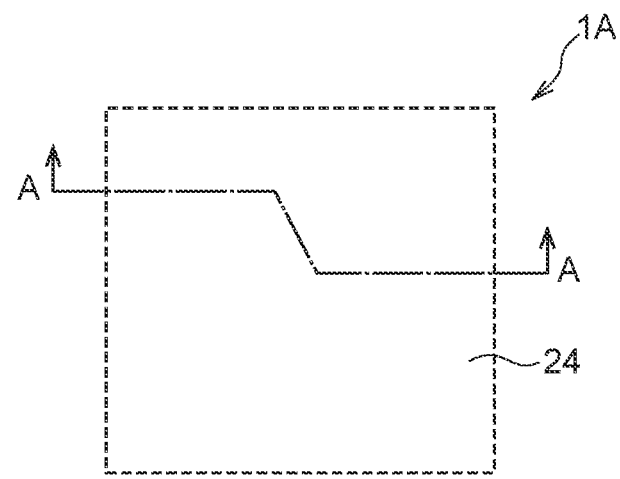
Figure 8B:
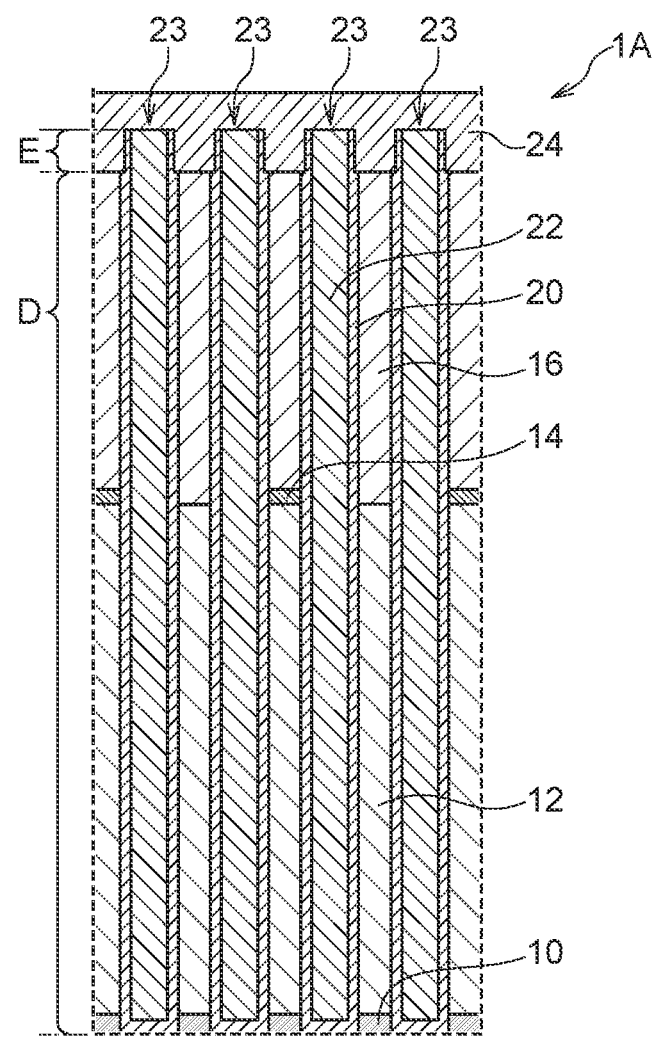

Next, as illustrated in FIGS. 8A and 8B, the sixth insulating film 24 is formed so as to cover the top face 16a of the fourth insulating film 16 as well as the side and top faces of the bottom electrodes 23 in the upper portion E. For example, the sixth insulating film 24 at least integrally covers the upper portion E. The sixth insulating film 24 contains silicon nitride, for example. The sixth insulating film 24 is formed by CVD, for example.

Figure 9A:
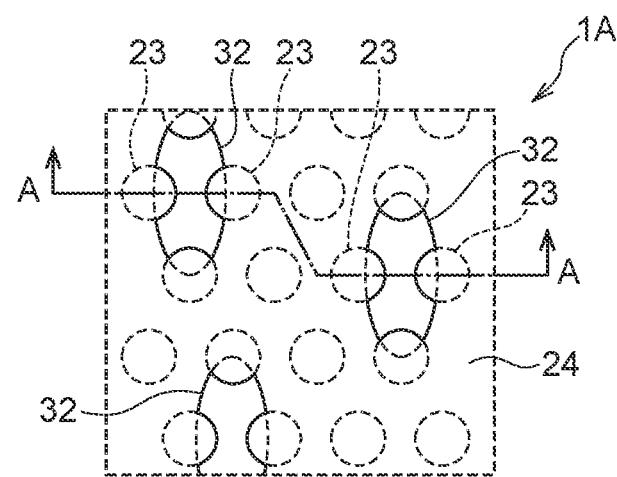
Figure 9B:
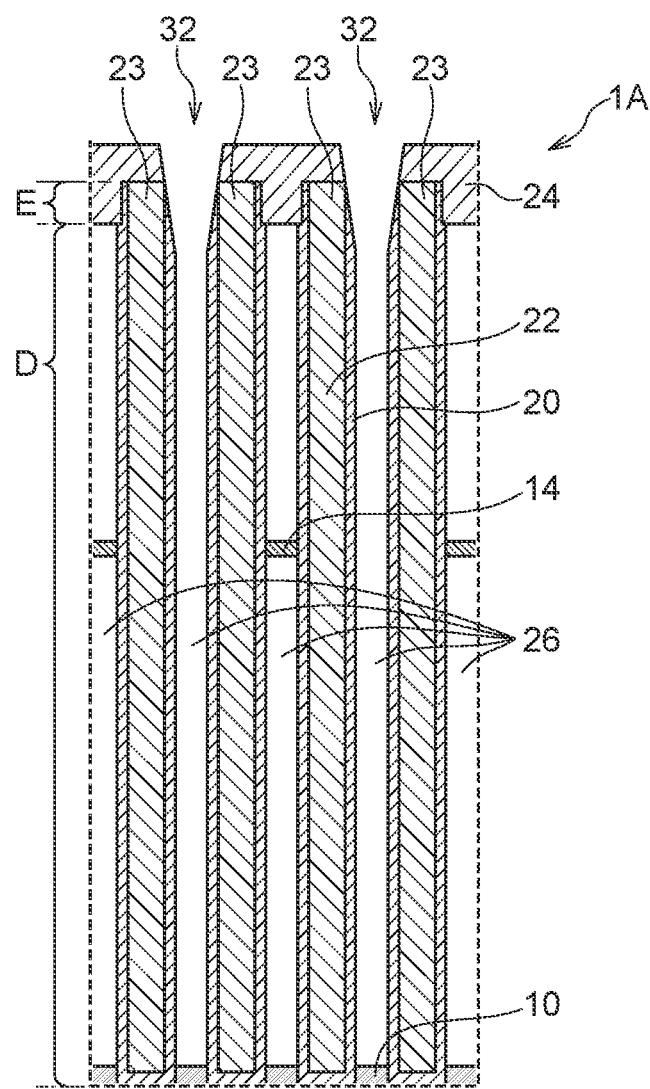

Next, as illustrated in FIGS. 9A and 9B, known lithography technology and dry etching technology are used to form holes 32 in the sixth insulating film 24. As illustrated in FIG. 9A, each of the holes 32 has an elliptical shape in a plan view, and the holes 32 are arranged in a staggered layout. Next, etching is performed using BHF for example to remove the fourth insulating film 16 and the second insulating film 12. The first insulating film 10 functions as an etching stopper.

The etching is achieved by BHF passing through the holes 32 to reach the fourth insulating film 16 and the second insulating film 12. Silicon dioxide is etched by BHF. Silicon nitride and titanium nitride are also etched by BHF, but the etch rate is extremely low, resulting in a sufficient selectivity ratio for silicon dioxide. For this reason, the etching amounts of silicon nitride and titanium nitride are small enough to ignore compared to the etching amount of silicon dioxide. Consequently, the etching by BHF can remove the fourth insulating film 16 and the second insulating film 12 while leaving the first insulating film 10, the third insulating film 14, the bottom electrodes 23, and the sixth insulating film 24. The first insulating film 10, the third insulating film 14, the bottom electrodes 23, and the sixth insulating film 24 substantially remain without being etched. The etching amounts of the fourth insulating film 16 and the second insulating film 12 can be controlled according to the etching time.

As illustrated in FIGS. 9A and 9B, the sixth insulating film 24 is in integrated contact with the top edge of each of the plurality of bottom electrodes 23. With this configuration, the sixth insulating film 24 acts as a top support that connects the plurality of bottom electrodes 23 to each other and improves the mechanical strength of the bottom electrodes 23. The sixth insulating film 24 functions as a support or a beam that supports the bottom electrodes 23. The plurality of bottom electrodes 23 are supported by the sixth insulating film 24 that functions as a beam. Also, the third insulating film 14 patterned into a similar pattern as the sixth insulating film 24 similarly connects the bottom electrodes 23 to each other and functions as a support or a beam that improves the mechanical strength of the bottom electrodes 23.

As illustrated in FIGS. 9A and 9B, through the etching by BHF described above, the bottom electrodes 23 are exposed from the bottom face of the sixth insulating film 24 to the top face of the first insulating film 10, such that spaces 26 are formed between the bottom electrodes 23.

Figure 10A:
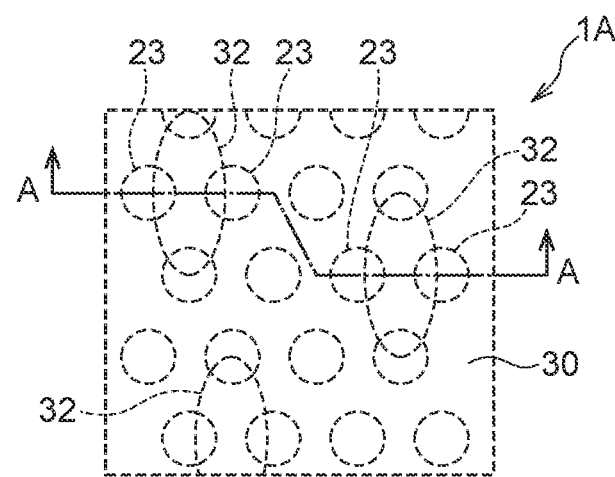
Figure 10B:
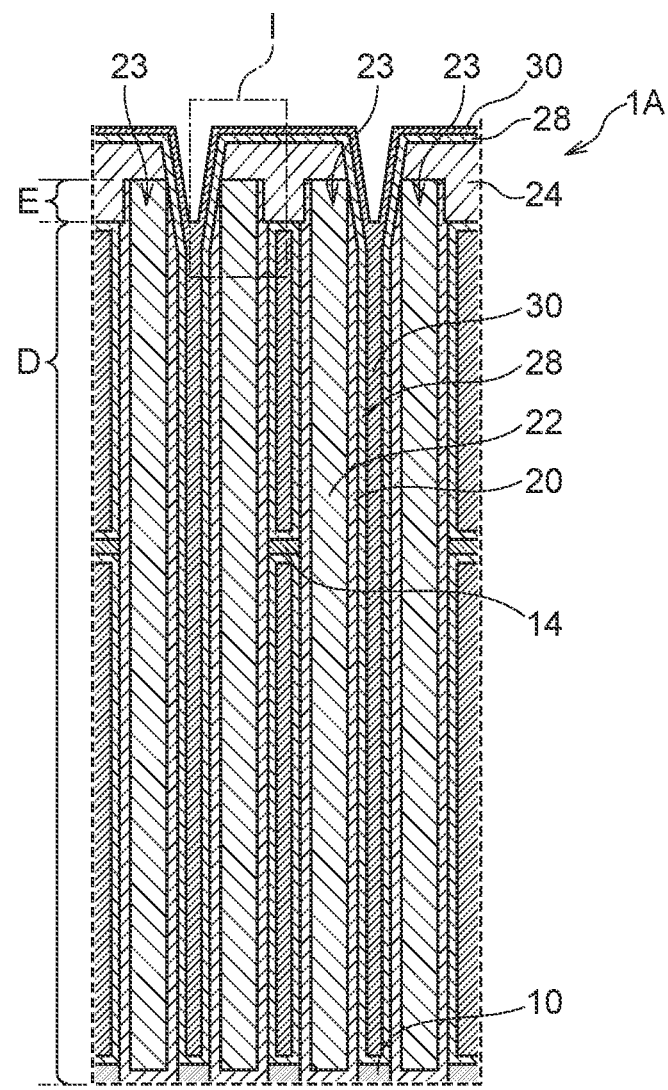

Next, as illustrated in FIGS. 10A and 10B, a capacitor insulating film 28 and a top electrode 30 are sequentially formed on the surfaces of the bottom electrodes 23 and the sixth insulating film 24. The capacitor insulating film 28 contains an insulating film. The capacitor insulating film 28 is a high-k film having a high dielectric constant for example, and contains an oxide material such as $HfO_2$, $ZrO_2$, or $Al_2O_3$, for example. The capacitor insulating film 28 is formed by CVD, for example. The top electrode 30 contains a conductive material such as titanium nitride, for example. The top electrode 30 is formed by CVD, for example. The top electrode 30 covers the side and top faces of the bottom electrode 23. By the above step, the capacitor 128 is formed having a structure in which the capacitor insulating film 28 is sandwiched by the bottom electrodes 23 and the top electrode 30.

Additionally, the semiconductor device 1A according to the first embodiment can be obtained by forming the upper layer part 154 illustrated in FIG. 22 above the capacitor 128.

Figure 10C:
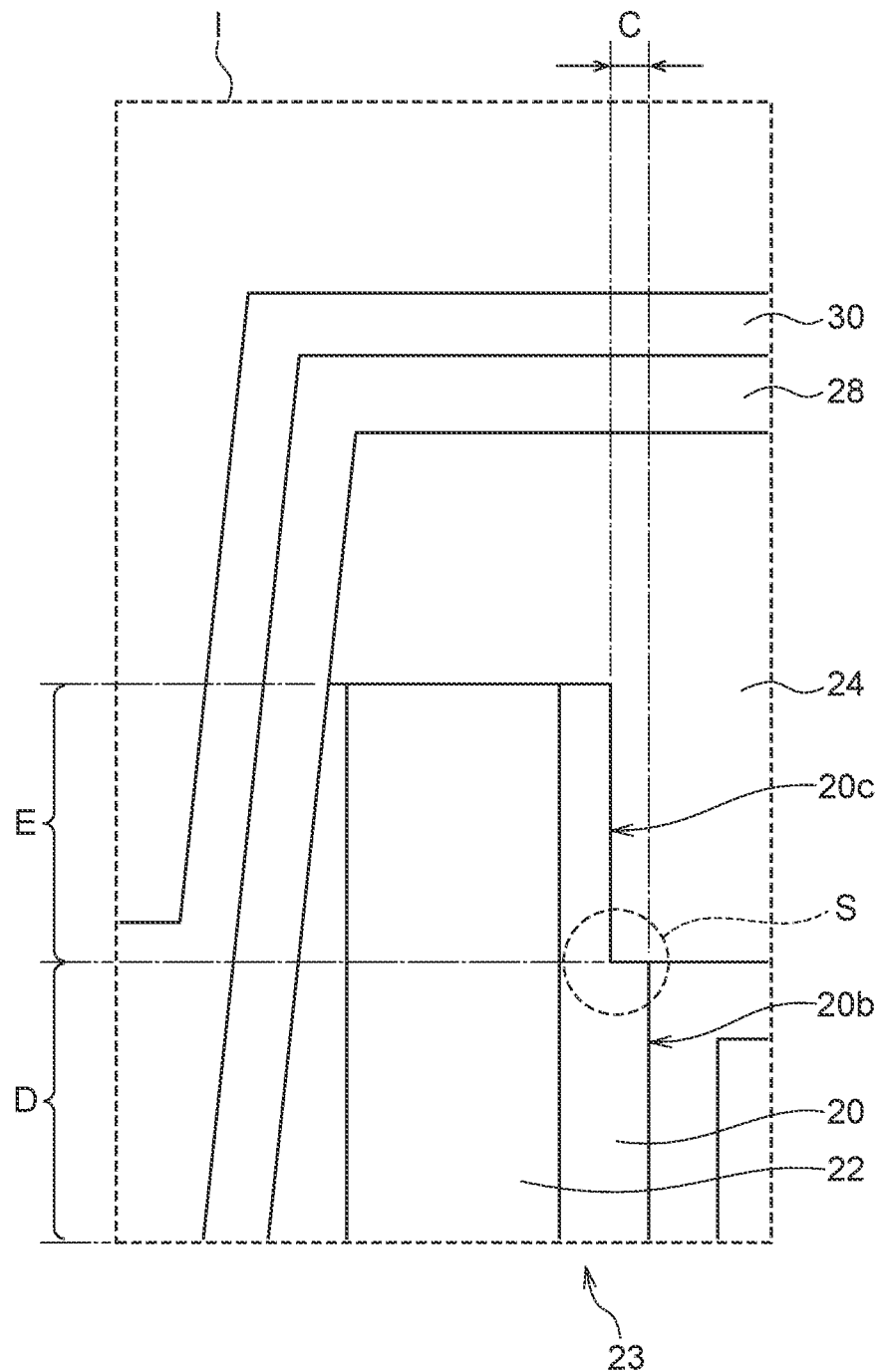

FIG. 10C is an enlarged view of the portion I of FIG. 10B, and is a diagram illustrating the structure of one of the bottom electrodes 23 including the boundary between the lower portion D and the upper portion E. The retreat amount C is the etching amount due to the etching performed in the step illustrated in FIGS. 7A and 7B. The step S is provided at the boundary between the first side face 20b of the bottom electrode 23 in the lower portion D and the second side face 20c of the bottom electrode 23 in the upper portion E.

The distance between adjacent bottom electrodes 23 becomes shorter as the diameter of the bottom electrodes 23 increases. Because the diameter of the bottom electrodes 23 increases at higher positions, the distance between adjacent bottom electrodes 23 becomes shorter in the upper part of the bottom electrodes 23.

According to the semiconductor device 1A and a method of forming the same according to the first embodiment, the following effects are obtained. Etching is performed in the upper portion E where the diameter of the bottom electrodes 23 is increased, thereby decreasing the diameter in the upper portion E. Consequently, at the top ends of the bottom electrodes 23, an appropriate distance is secured between the bottom electrodes 23 adjacently arranged, and a region allowing the formation of the capacitor insulating film 28 and the top electrode 30 without blockage can be secured. Furthermore, it is possible to secure the capacitance of the capacitor 128 to be formed by not reducing the diameter in the lower portion D.

Also, the opening diameter is increased in the upper part of the holes 19 that act as models for the shape of the bottom electrodes 23, but in the first embodiment, the fifth insulating film 18 is removed in the upper part of the holes 19. Consequently, the diameter in the upper portion of the bottom electrodes 23 is decreased, making it possible to set a wider distance between the bottom electrodes 23 adjacently arranged.

Also, when forming the holes 19, because the holes 19 are formed having a large top diameter, blockage in the floor of the holes 19 due to a smaller bottom diameter of the holes 19 can be avoided. With this configuration, the bottom electrodes 23 can be formed having an appropriate shape from the upper portion down to the floor. According to the above, the yield of the semiconductor device 1A can be improved.

Second Embodiment

Hereinafter, a semiconductor device 1B and a method of forming the same according to a second embodiment will be described. Structural elements that are the same as the first embodiment are denoted with the same signs, and description thereof will be omitted.

Figure 11A:
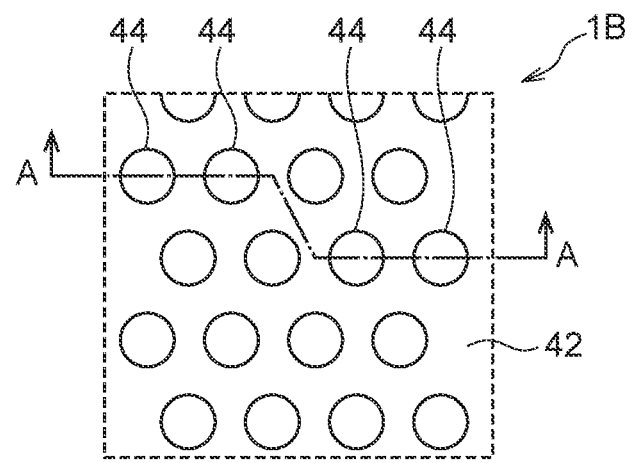
Figure 11B:
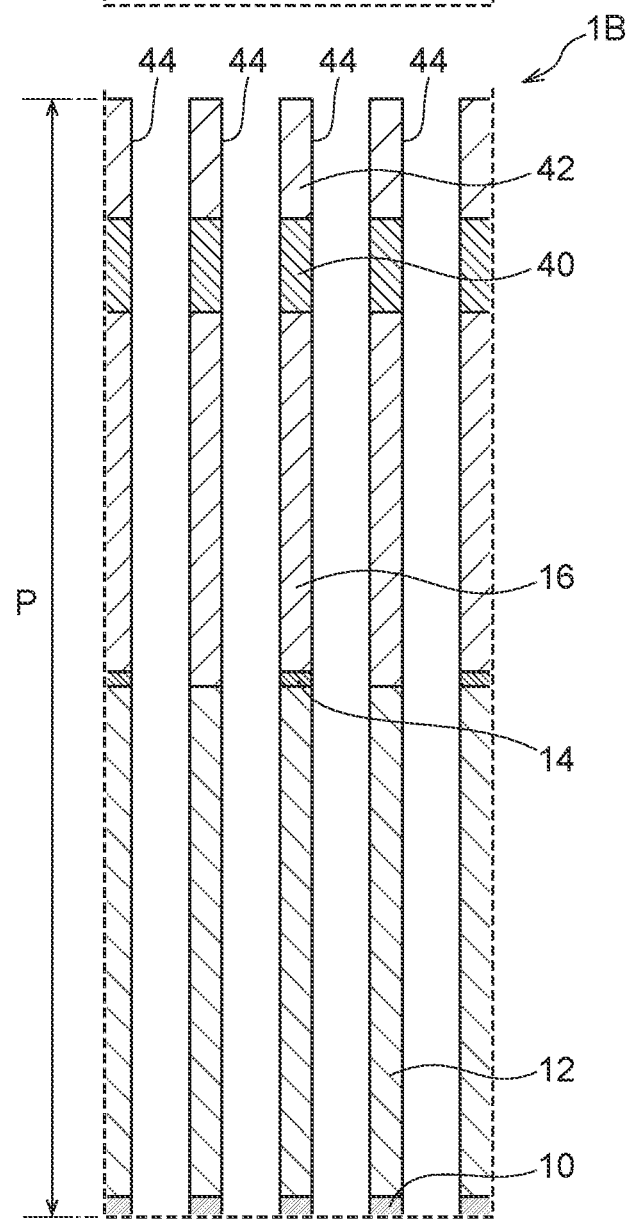

As illustrated in FIGS. 11A and 11B, a first insulating film 10, a second insulating film 12, a third insulating film 14, a fourth insulating film 16, a seventh insulating film 40, and an eighth insulating film 42 are formed on a semiconductor substrate provided with components such as an active region, an access transistor, a word line, and a bit line, which are not illustrated. The first insulating film 10, the second insulating film 12, the third insulating film 14, the fourth insulating film 16, and the seventh insulating film 40 are all insulating films. The first insulating film 10, the third insulating film 14, and the seventh insulating film 40 contain silicon nitride (SiN) for example. The second insulating film 12 and the fourth insulating film 16 contain silicon dioxide ($SiO_2$) for example.

The second insulating film 12 contains BPSG for example. The fourth insulating film 16 contains silicon dioxide formed by plasma CVD using TEOS as a raw material, for example. The eighth insulating film 42 contains a material having an etching selectivity ratio with respect to silicon dioxide and silicon nitride. For example, the eighth insulating film 42 contains a material such as silicon, amorphous carbon, or tungsten.

The first insulating film 10, the second insulating film 12, the third insulating film 14, the fourth insulating film 16, the seventh insulating film 40, and the eighth insulating film 42 are formed by CVD, for example. The third insulating film 14 is patterned in a pattern similar to a sixth insulating film 24 illustrated in FIGS. 15A and 15B described later using known photolithography technology and dry etching technology.

With respect to the structure in which the first insulating film 10, the second insulating film 12, the third insulating film 14, the fourth insulating film 16, the seventh insulating film 40, and the eighth insulating film 42 are sequentially formed in this way, a plurality of holes 44 are formed using known photolithography technology and dry etching technology, as illustrated in FIGS. 11A and 11B. As illustrated in FIG. 11A, each of the holes 44 is round in a plan view, and the holes 44 are arranged in a staggered layout.

To form the holes 44, first, known photolithography technology and dry etching technology are used to pattern the eighth insulating film 42, and then the photoresist is removed, for example. Next, the patterned eighth insulating film 42 is used as an etching mask to etch the seventh insulating film 40, the fourth insulating film 16, and the second insulating film 12. Thereafter, the eighth insulating film 42 is removed.

As illustrated in FIG. 1B, the holes 44 are formed penetrating from a top face of the eighth insulating film 42 to a bottom face of the first insulating film 10. The vertical length P of the holes 44 is extremely long compared to the diameter of the holes 44. In other words, the aspect ratio of the holes 44 is extremely large. Herein, the aspect ratio of each hole 44 is computed by taking "vertical length P of hole 44/diameter of hole 44". For the diameter of the holes 44, the diameter at the upper end of the holes 44 is used.

As illustrated in FIGS. 11A and 11B, because the holes 44 have a large aspect ratio, the opening diameter in an upper portion of the holes 44 is large, while the opening diameter in a lower portion is small.

Figure 12A:
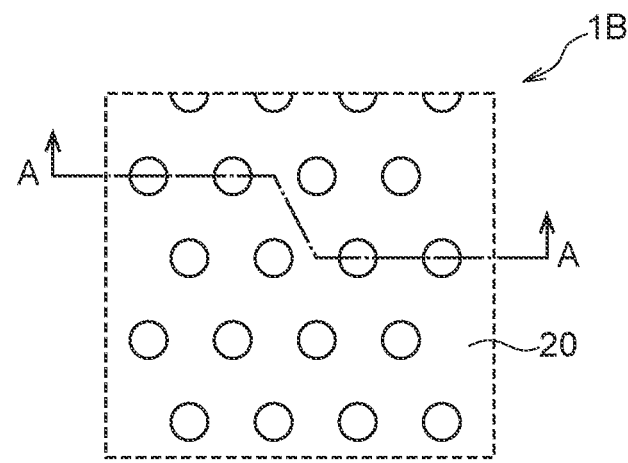
Figure 12B:
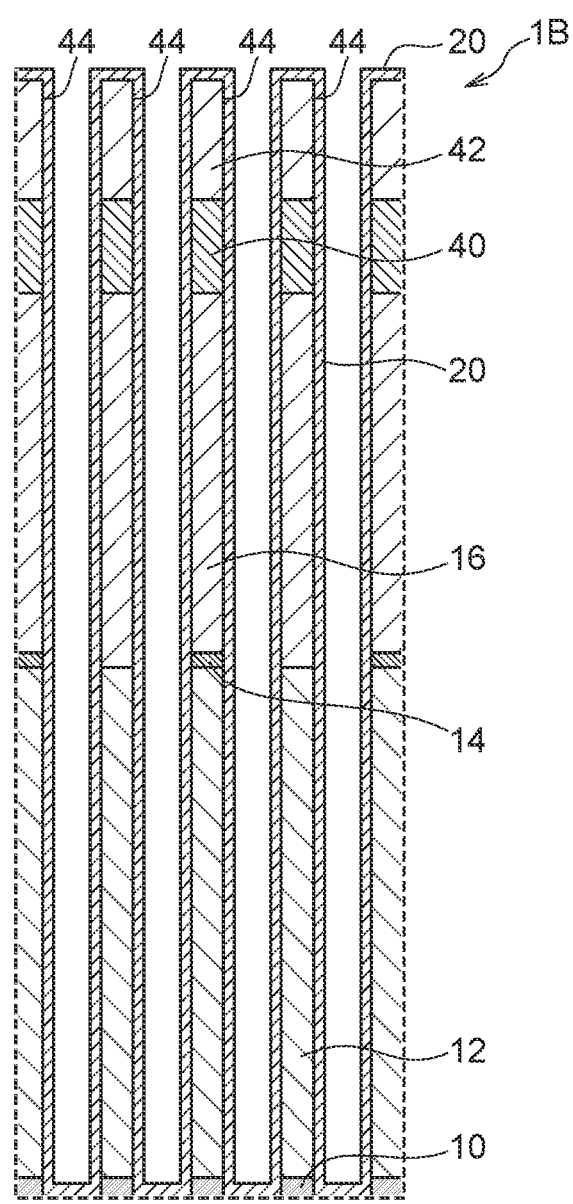

Next, as illustrated in FIGS. 12A and 12B, a first conductive film 20 is formed so as to cover the inside of the holes 44 and the top face of the eighth insulating film 42. The first conductive film 20 is formed along the side walls inside the holes 44, having a thickness that is not enough to fill the holes 44.

Figure 13A:
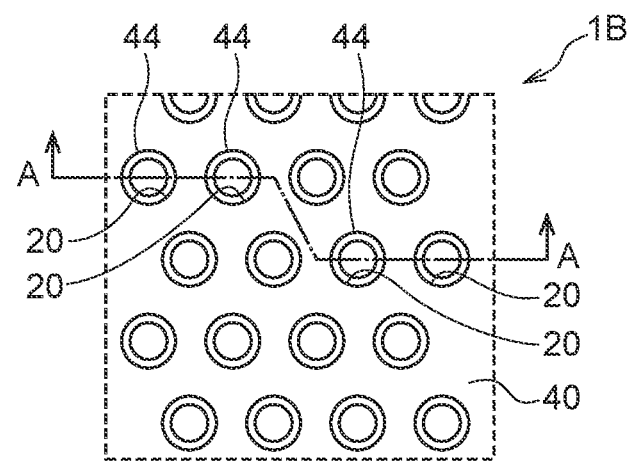
Figure 13B:
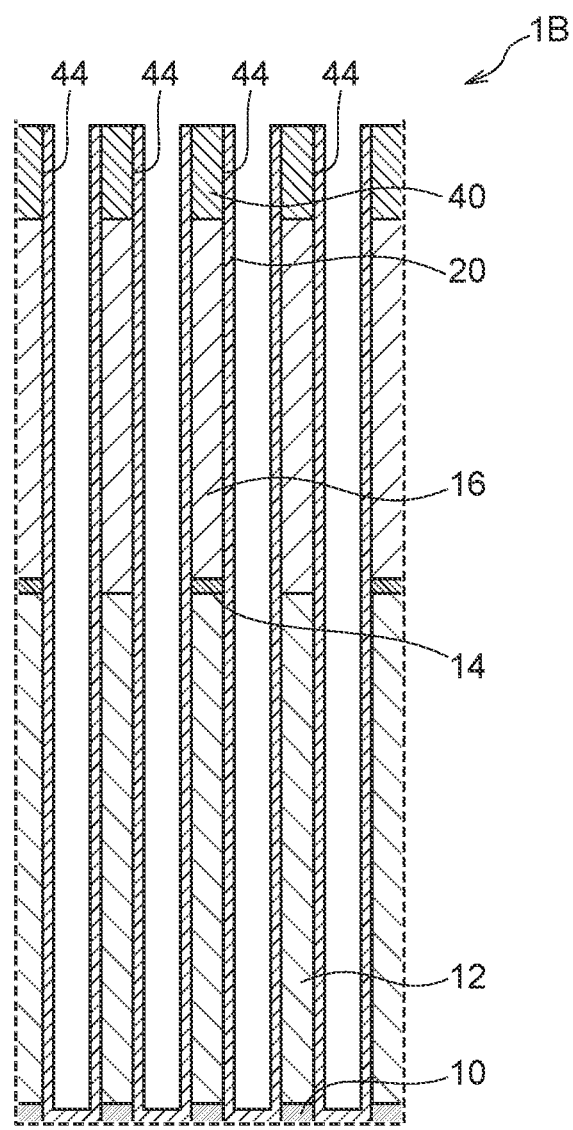

Next, as illustrated in FIGS. 13A and 13B, the first conductive film 20 and the eighth insulating film 42 are etched back under conditions such that the etch rates of the first conductive film 20 and the eighth insulating film 42 are substantially the same, until the top face of the seventh insulating film 40 is exposed. With this configuration, the first conductive film 20 can be formed along the side walls and the floor inside the holes 44.

Inside each of the holes 44, a cavity is formed on the inner side of the first conductive film 20. Note that instead of the above etchback, the first conductive film 20 and the eighth insulating film 42 may also be subjected to CMP until the top face of the seventh insulating film 40 is exposed. In this case, the seventh insulating film 40 containing silicon nitride can be treated as a stopper for the CMP.

Figure 14A:
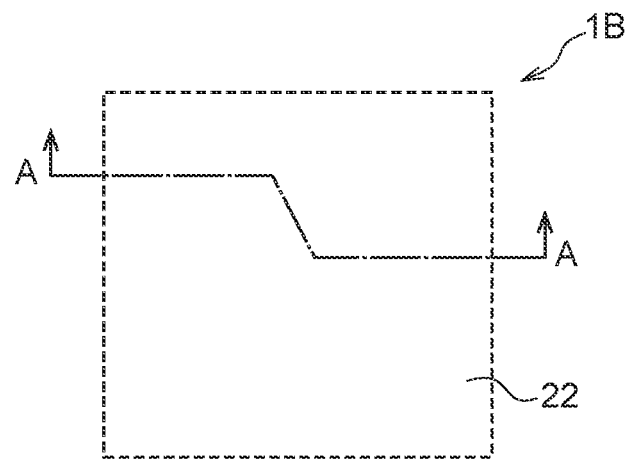
Figure 14B:
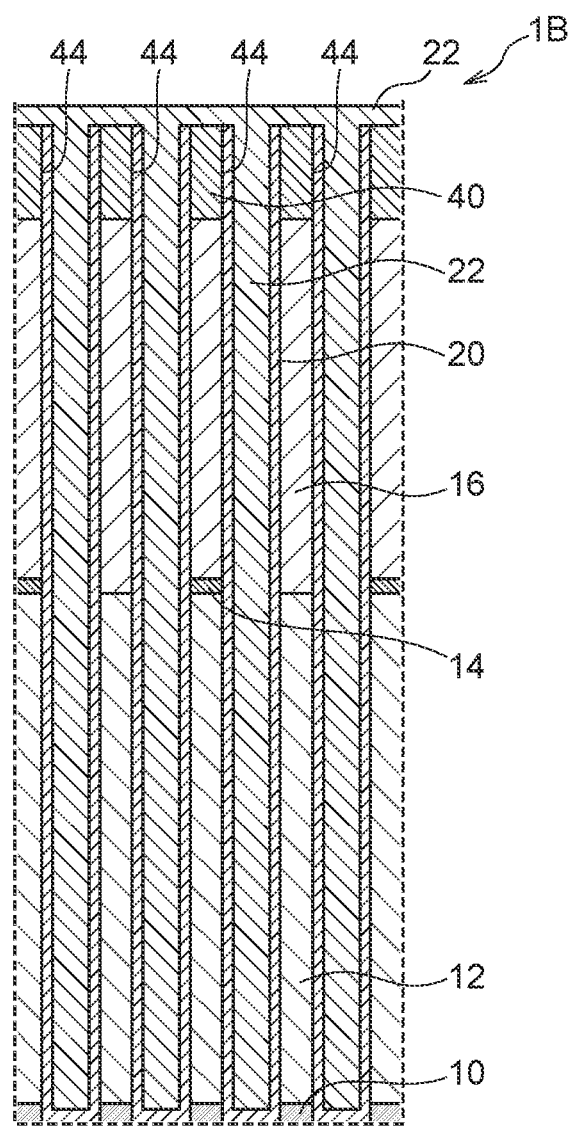

Next, as illustrated in FIGS. 1A and 14B, a second conductive film 22 is formed so as to be embedded inside the holes 44 and covering the top faces of the seventh insulating film 40 and the first conductive film 20 as well as the inner walls of the first conductive film 20.

Figure 15A:
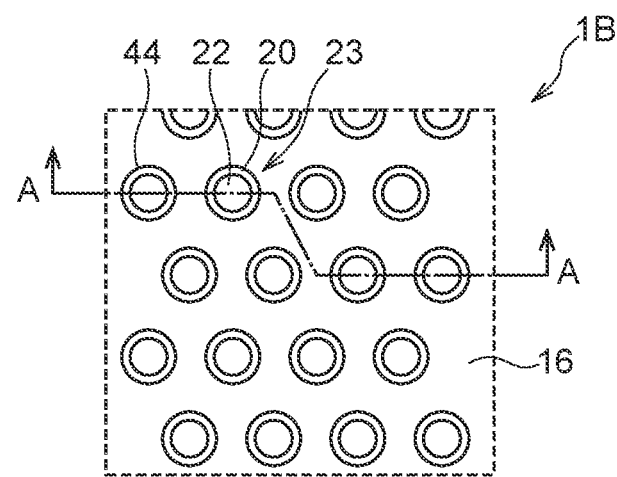
Figure 15B:
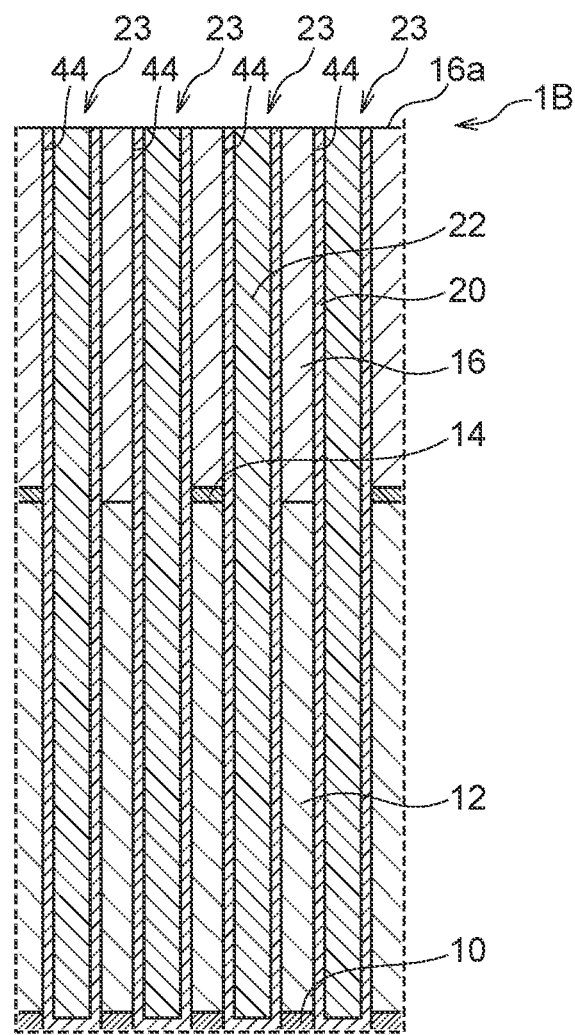

Next, as illustrated in FIGS. 15A and 15B, the first conductive film 20, the second conductive film 22, and the seventh insulating film 40 are etched back until the top face 16a of the fourth insulating film 16 is exposed. With this configuration, a bottom electrode 23 containing the first conductive film 20 and the second conductive film 22 can be formed inside each of the holes 44. The first conductive film 20 and the second conductive film 22 both contain titanium nitride, and therefore unite to form the bottom electrodes 23. Note that CMP may also be performed instead of the above etchback.

Next, steps similar to the steps illustrated in FIGS. 6A and 6B to FIGS. 10A and 10B described in the first embodiment are executed. Additionally, the semiconductor device 1B according to the second embodiment can be obtained by forming the upper layer part 154 illustrated in FIG. 22 above the capacitor 128.

Figure 16A:
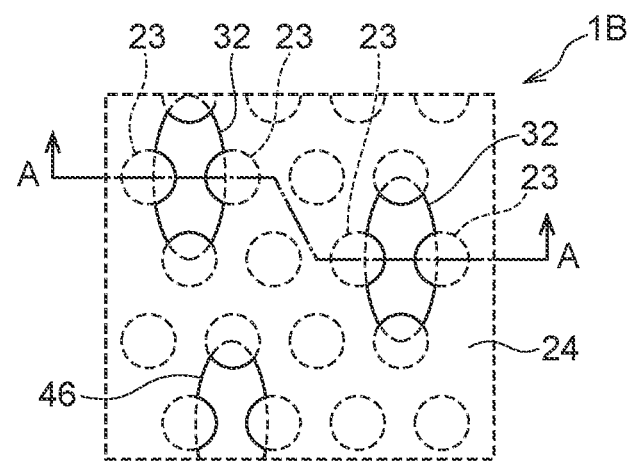
Figure 16B:
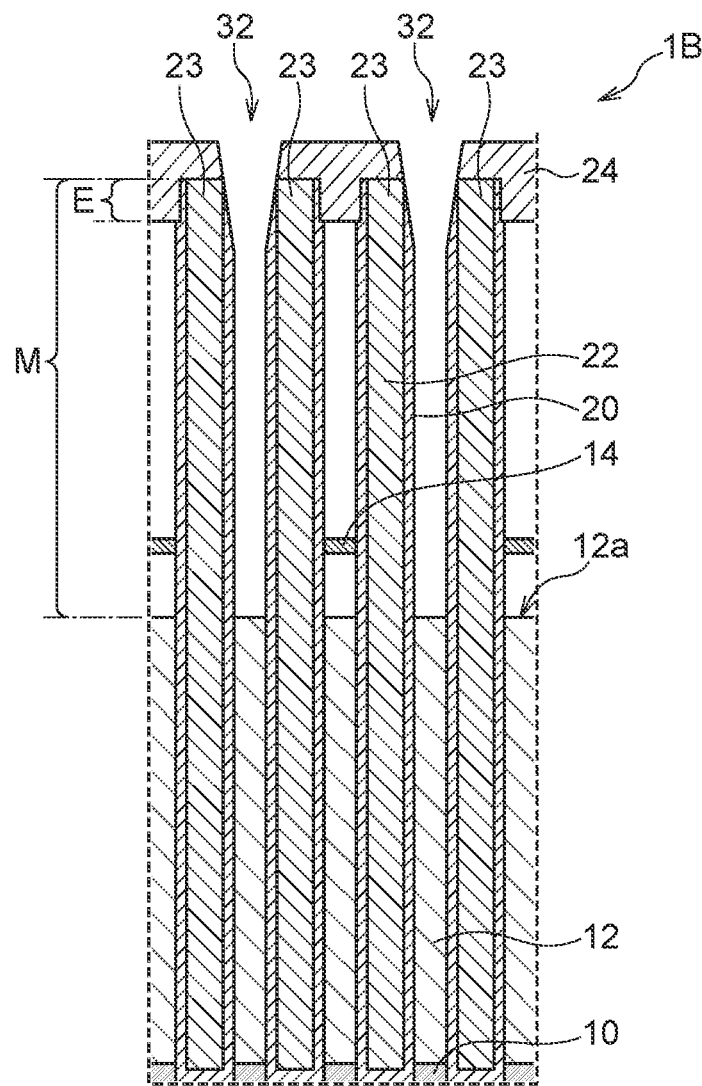

Note that after performing the step similar to the step illustrated in FIGS. 8A and 8B, the steps illustrated in FIGS. 16A and 16B and FIGS. 17A and 17B described below may also be added. As illustrated in FIGS. 16A and 16B, known lithography technology and dry etching technology are used to form holes 32 in the sixth insulating film 24. As illustrated in FIG. 16A, each of the holes 32 has an elliptical shape in a plan view, and the holes 32 are arranged in a staggered layout. Next, etching is performed using BHF for example to remove the fourth insulating film 16 and a part of the second insulating film 12, specifically the fourth insulating film 16 and the second insulating film 12 in the region M in the diagram.

The etching is achieved by BHF passing through the holes 32 to reach the fourth insulating film 16 and the second insulating film 12. Silicon oxide films are etched by BHF. Silicon nitride films and titanium nitride films are also etched by BHF, but the etch rate is extremely low, resulting in a sufficient selectivity ratio for silicon oxide films. For this reason, the etching amount by which the silicon nitride films and the titanium nitride films are etched is small enough to ignore. Consequently, the etching by BHF can remove a part of the fourth insulating film 16 and the second insulating film 12, leaving the sixth insulating film 24, the third insulating film 14, and the bottom electrodes 23. The sixth insulating film 24, the third insulating film 14, and the bottom electrodes 23 substantially remain without being etched. The etching amount of the second insulating film 12 can be controlled according to the etching time. By controlling the etching time, the position of the top face 12a of the second insulating film 12 can be controlled.

As illustrated in FIGS. 16A and 16B, at the upper ends of the bottom electrodes 23, the sixth insulating film 24 patterned in a mesh is in integrated contact with the upper ends of all of the bottom electrodes 23. With this configuration, the sixth insulating film 24 acts as a top support that connects the plurality of the bottom electrodes 23 to each other and improves the mechanical strength of the bottom electrodes 23, and functions as a support or a beam that supports the bottom electrodes 23. Also, the third insulating film 14 patterned in a pattern similar to the sixth insulating film 24 similarly acts as a top support that connects the plurality of the bottom electrodes 23 to each other and improves the mechanical strength of the bottom electrodes 23, and functions as a support or a beam that supports the bottom electrodes 23. As illustrated in FIG. 16A, the holes 32 are arranged in a layout such that each hole 32 is positioned between four adjacent bottom electrodes 23 and partially overlaps with the four adjacent bottom electrodes 23.

As illustrated in FIG. 16B, by etching with BHF as described above, the surfaces of the bottom electrodes 23 are exposed in the region above the top face 12a of the second insulating film 12, namely the region M in the diagram.

Figure 17A:
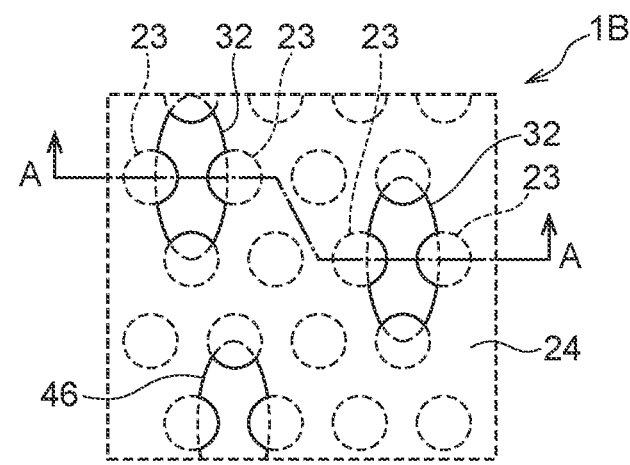
Figure 17B:
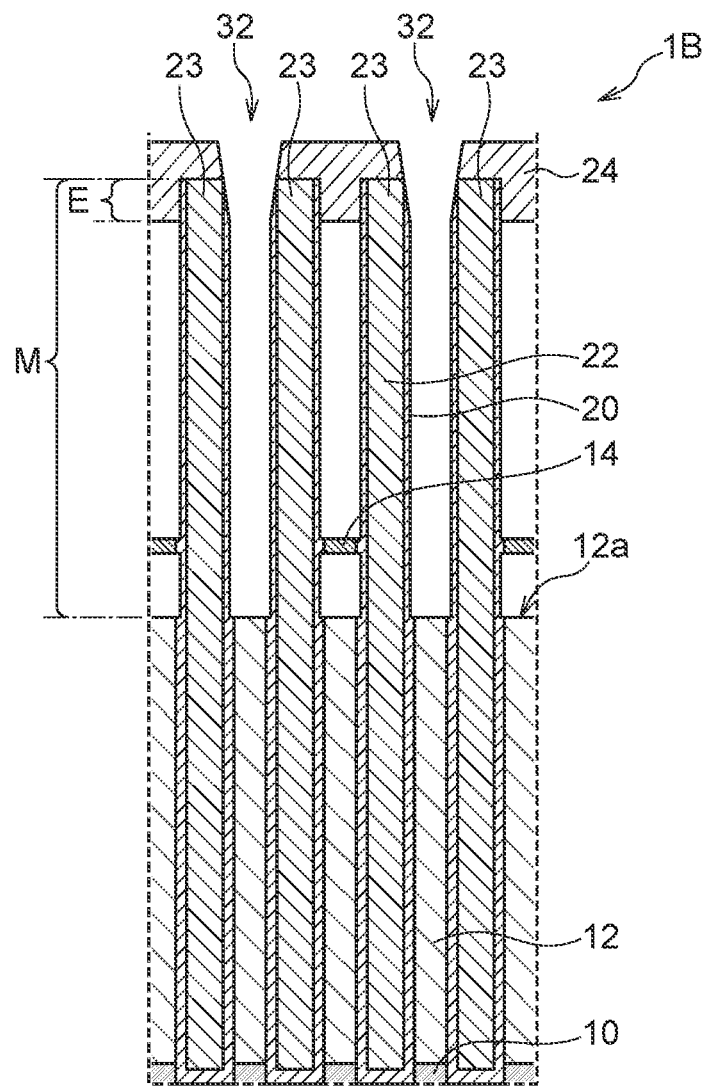

Next, as illustrated in FIGS. 17A and 17B, the bottom electrodes 23 exposed in the region M are etched to decrease the diameter of the bottom electrodes 23. The etching is performed using a diluted hydrogen peroxide solution, for example. The etching amount can be controlled by adjusting the processing time. In the etching by the diluted hydrogen peroxide solution, the titanium nitride included in the bottom electrodes 23 has a sufficient selectivity ratio with respect to the sixth insulating film 24 and the third insulating film 14 containing silicon nitride and the second insulating film 12 containing silicon dioxide. For this reason, the etching amount by which sixth insulating film 24, the third insulating film 14, and the second insulating film 12 are etched is small enough to ignore. The sixth insulating film 24, the third insulating film 14, and the second insulating film 12 substantially remain without being etched.

According to the semiconductor device 1B and the method of forming the same according to the second embodiment, effects similar to the first embodiment are obtained. Also, in the second embodiment, because the holes 44 that act as models for the shape of the bottom electrodes 23 have a large aspect ratio as illustrated in FIGS. 11A and 11B, the opening diameter in an upper portion of the holes 44 is large, while the opening diameter in a lower portion is small. In the second embodiment, the seventh insulating film 40 and the eighth insulating film 42 in the upper portion of the holes 44 are removed. For this reason, the portion of increased opening diameter is removed over a longer length than the first embodiment. Consequently, the diameter in the upper portion of the bottom electrodes 23 is decreased, making it possible to set a wider distance between the bottom electrodes 23 adjacently arranged.

Third Embodiment

Hereinafter, a semiconductor device 1C and a method of forming the same according to the third embodiment will be described. Structural elements that are the same as the first and second embodiments are denoted with the same signs, and description thereof will be omitted.

Figure 18A:
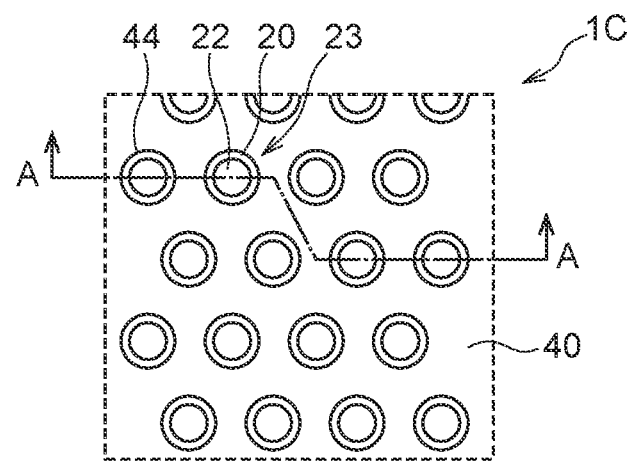
Figure 18B:
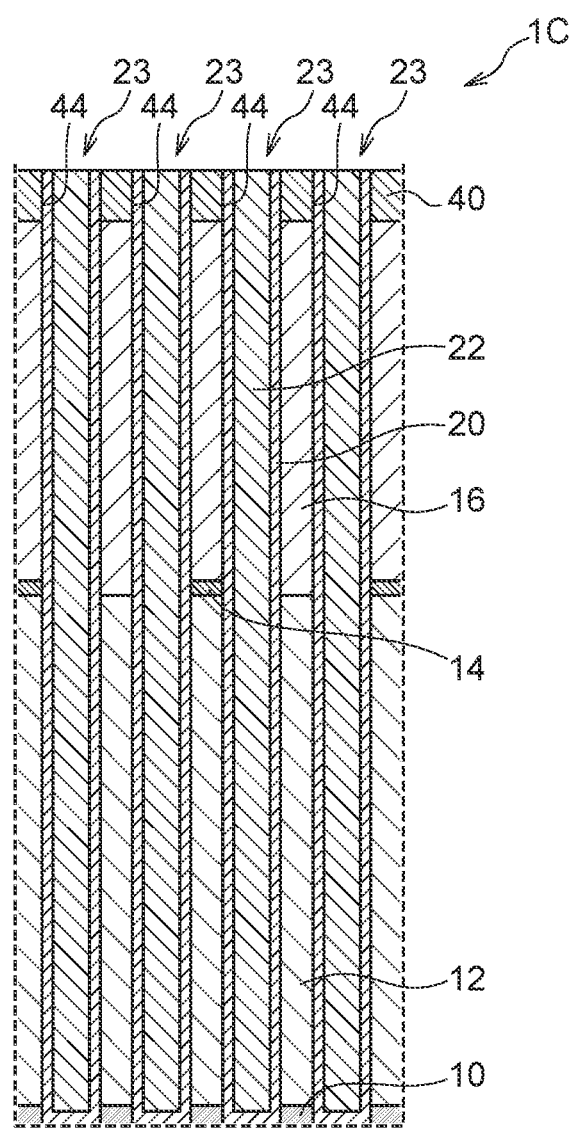

First, steps similar to the steps illustrated in FIGS. 11A and 11B to FIGS. 14A and 14B described in the second embodiment are executed. Next, as illustrated in FIGS. 18A and 18B, the first conductive film 20, the second conductive film 22, and the seventh insulating film 40 are etched back such that the seventh insulating film 40 is lowered to a predetermined height. A predetermined thickness of the seventh insulating film 40 remains. The top face of the seventh insulating film 40 is set to a position that is lower than the bottom face of the eighth insulating film 42 and higher than the top face of the fourth insulating film 16.

With this configuration, a bottom electrode 23 containing the first conductive film 20 and the second conductive film 22 is formed inside each of the holes 44. The first conductive film 20 and the second conductive film 22 both contain titanium nitride, and therefore unite to form the bottom electrodes 23. Note that CMP may also be performed instead of the above etchback.

Figure 19A:
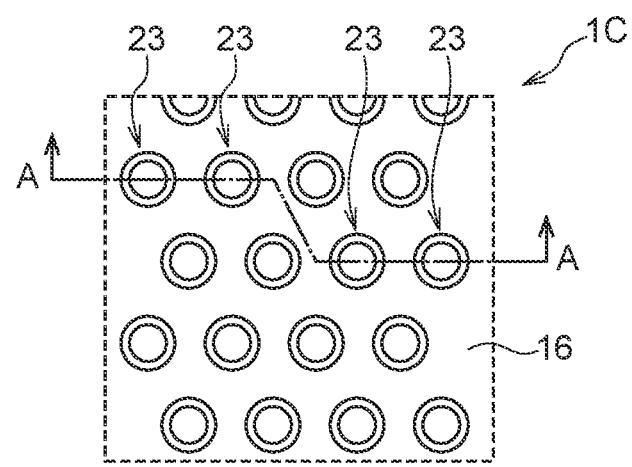
Figure 19B:
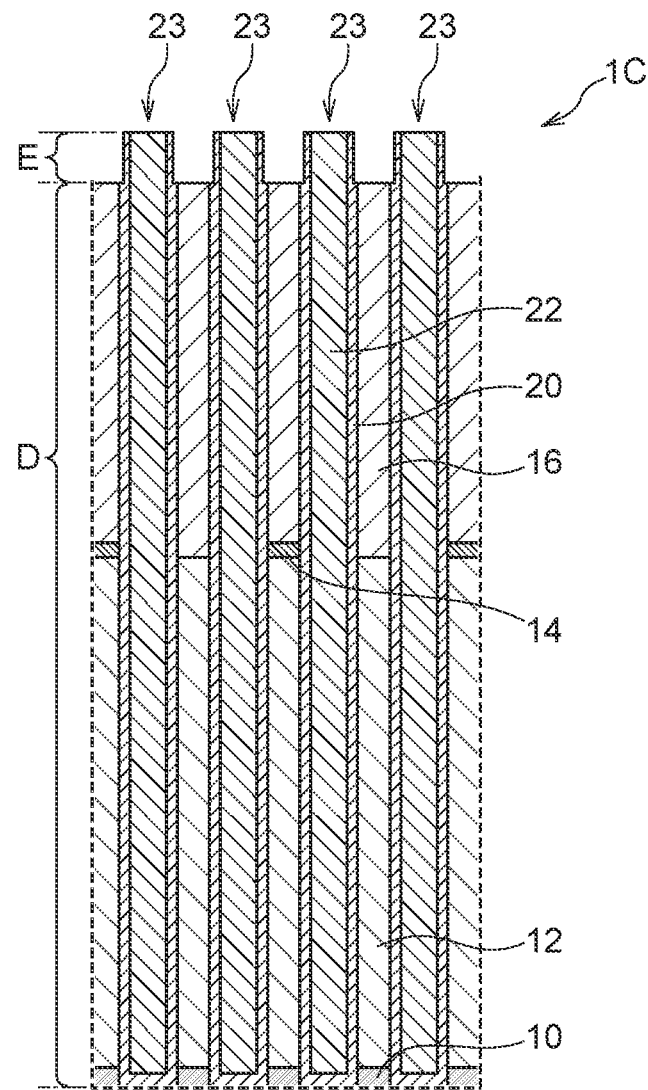

Next, as illustrated in FIGS. 19A and 19B, etching is performed to selectively remove the seventh insulating film 40. Here, wet etching in hot phosphoric acid can be used, for example. In wet etching using hot phosphoric acid, the seventh insulating film 40 containing silicon nitride is selectively etched, while the bottom electrodes 23 containing titanium nitride and the fourth insulating film 16 containing silicon dioxide are etched little or none. Also, instead of wet etching with hot phosphoric acid, dry etching capable of selectively etching the seventh insulating film 40 may also be performed. With this etching, the seventh insulating film 40 is removed, and an upper portion E is formed in which a portion of the bottom electrodes 23 projects from the top face 16b of the fourth insulating film 16.

Next, the upper portion E of the bottom electrodes 23 exposed from the fourth insulating film 16 is etched to narrow the diameter of the bottom electrodes 23. The etching is performed using a diluted hydrogen peroxide solution, for example. The titanium nitride included in the bottom electrodes 23 is etched by the diluted hydrogen peroxide solution. The bottom electrodes 23 are provided with a configuration similar to FIG. 7C illustrated in the description of the first embodiment.

Figure 20A:
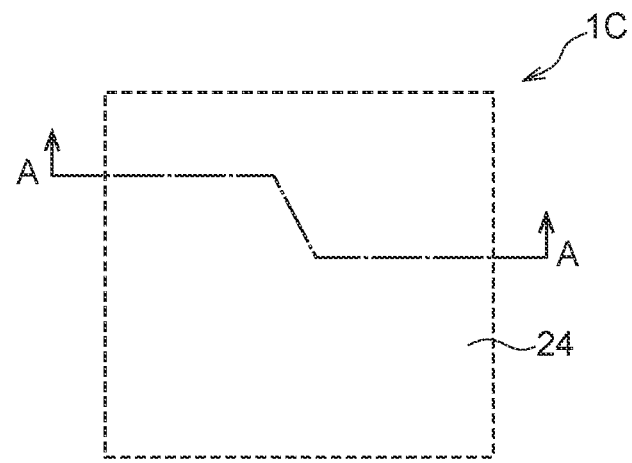
Figure 20B:
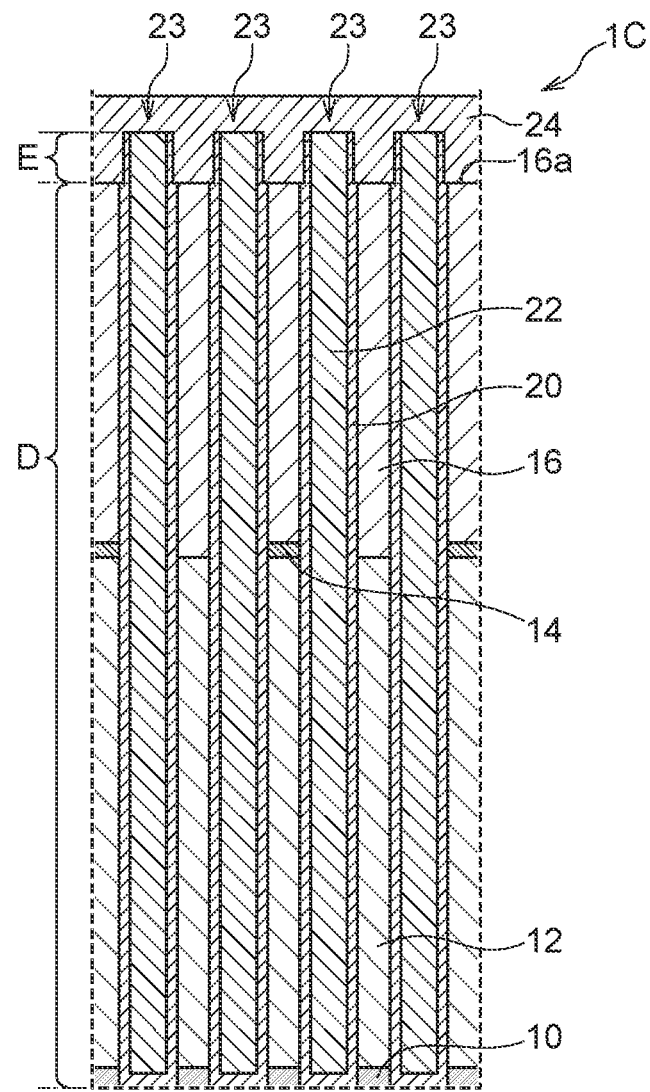

Next, as illustrated in FIGS. 20A and 20B, the sixth insulating film 24 is formed so as to cover the top face 16a of the fourth insulating film 16 as well as the side and top faces of the bottom electrodes 23. The sixth insulating film 24 contains silicon nitride, for example. The sixth insulating film 24 is formed by CVD, for example.

Next, as illustrated in FIGS. 21A and 21B, known lithography technology and dry etching technology are used to form holes 32 in the sixth insulating film 24. As illustrated in FIG. 21A, each of the holes 32 has an elliptical shape in a plan view, and the holes 32 are arranged in a staggered layout. Next, etching is performed using BHF for example to remove the fourth insulating film 16 and the second insulating film 12. The first insulating film 10 functions as an etching stopper. Consequently, the bottom electrodes 23 are exposed from the bottom face of the sixth insulating film 24 to the top face of the first insulating film 10, such that spaces 26 are formed between the bottom electrodes 23.

Next, a step similar to the step illustrated in FIGS. 10A and 10B described in the first embodiment is executed. Additionally, the semiconductor device 1C according to the third embodiment can be obtained by forming the upper layer part 154 illustrated in FIG. 22 above the capacitor 128.

Note that after performing the step illustrated in FIGS. 20A and 20B, steps similar to the steps illustrated in FIGS. 16A and 16B and FIGS. 17A and 17B described in the second embodiment may also be added.

According to the semiconductor device 1C and a method of forming the same according to the third embodiment, effects similar to the semiconductor devices 1A and 1B according to the first and second embodiments are obtained.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method comprising:
   forming a first insulating film over a substrate;
   forming a plurality of first holes penetrating the first insulating film;
   filling each of the plurality of first holes with a conductive material to form a plurality of pillar-shaped bottom electrodes;
   removing a top part of the first insulating film to expose one or more of upper portions of the plurality of pillar-shaped bottom electrodes;
   partially etching the exposed upper portions of the plurality of pillar-shaped bottom electrodes to increase a distance between the exposed upper portions of the pillar-shaped bottom electrodes adjacently arranged;
   removing the first insulating film to expose lower portions of the plurality of pillar-shaped bottom electrodes; and
   forming upper electrodes to cover the exposed lower and upper portions of the plurality of pillar-shaped bottom electrodes with intervening capacitor insulating films therebetween.

2. The method of claim 1, wherein the lower portion is provided at the upper end of each of the pillar-shaped bottom electrodes.

3. The method of claim 1, wherein a step is provided at e boundary between the upper portion and the lower portion.

4. The method of claim 1, further comprising forming a second insulating film integrally covering a plurality of the upper potions after partially etching the exposed upper portions of the plurality of pillar-shaped bottom electrodes to increase the distance between the exposed upper portions of the pillar-shaped bottom electrodes adjacently arranged.

5. The method of claim 4, further comprising:
   forming a plurality of second holes penetrating the second insulating film; and
   etching the first insulating film through the second hole to expose the lower portion.

6. The method of claim 5, wherein the second insulating film substantially remains without being etched and functions as a beam that supports the pillar-shaped bottom electrodes.

7. A method comprising;
   forming a first insulating film over a substrate;
   forming a second insulating film on the first insulating film;

forming a third insulating film on the second insulating film, the third insulating film having a plurality of openings;

forming a fourth insulating film on the third insulating film;

forming a fifth insulating film on the fourth insulating film;

forming a plurality of first holes reaching from the upper surface of the fifth insulating film to a bottom surface of the first insulating film;

filling each of the plurality of first holes with a conductive material to form a plurality of pillar-shaped bottom electrodes;

removing the fifth insulating film to expose upper portions of the plurality of pillar-shaped bottoms electrodes;

partially etching the exposed upper portions of the plurality of pillar-shaped bottom electrodes to increase a distance between the exposed upper portion of the pillar-shaped bottom electrodes adjacently arranged; and forming upper electrodes to cover the exposed lower and upper portions of the plurality of pillar-shaped bottom electrodes with intervening capacitor insulating films therebetween.

8. The method of claim 7, wherein the lower portion is provide the upper end of each of the pillar-shaped bottom electrodes.

9. The method of claim 7, wherein a step is provided at the boundary between the upper portion and the lower portion.

10. The method of claim 7, further comprising forming a sixth insulating film at least integrally covering a plurality of the upper potions after partially etching the exposed upper portions of the plurality of pillar-shaped bottom electrodes to increase the distance between the exposed upper portion of the pillar-shaped bottom electrodes adjacently arranged.

11. The method of claim 10, further comprising;

forming a plurality of second holes penetrating the sixth insulating film; and etching the second and fourth insulating films through the second holes to expose the lower portion.

12. The method of claim 11, wherein the sixth insulating film substantially remains without being etched and functions as a beam that supports the pillar-shaped bottom electrodes.

* * * * *

UNITED STATES PATENT AND TRADEMARK OFFICE
CERTIFICATE OF CORRECTION

| | |
|---|---|
| PATENT NO. | : 11,647,624 B2 |
| APPLICATION NO. | : 17/122706 |
| DATED | : May 9, 2023 |
| INVENTOR(S) | : Akira Kaneko and Keisuke Otsuka |

It is certified that error appears in the above-identified patent and that said Letters Patent is hereby corrected as shown below:

In the Claims

| Column, Line | Reads | Should Read |
|---|---|---|
| Column 12, Line 47 | "wherein a step is provided at e boundary between the upper portion and the lower portion" | -- wherein a step is provided at the boundary between the upper portion and the lower portion -- |
| Column 13, Line 14 | "pillar-shaped bottoms electrodes" | -- pillar-shaped bottom electrodes -- |
| Column 14, Line 2 | "wherein the lower portion is provide the upper end" | -- wherein the lower portion is provided at the upper end -- |

Signed and Sealed this
Nineteenth Day of September, 2023

Katherine Kelly Vidal
*Director of the United States Patent and Trademark Office*